United States Patent
Tanaka et al.

(10) Patent No.: US 7,424,727 B2
(45) Date of Patent: Sep. 9, 2008

(54) DISK ARRAY DEVICE AND DISK ARRAY DEVICE HOUSING

(75) Inventors: Shigeaki Tanaka, Odawara (JP); Yasuji Morishita, Odawara (JP); Tadahisa Ishiwata, Odawara (JP)

(73) Assignee: Hitachi, Ltd., Tokyo (JP)

( * ) Notice: Subject to any disclaimer, the term of this patent is extended or adjusted under 35 U.S.C. 154(b) by 529 days.

(21) Appl. No.: 11/043,494

(22) Filed: Jan. 25, 2005

(65) Prior Publication Data

US 2006/0123436 A1 Jun. 8, 2006

(30) Foreign Application Priority Data

Dec. 6, 2004 (JP) ............................. 2004-352217

(51) Int. Cl.
*G11B 33/14* (2006.01)
(52) U.S. Cl. ..................................................... 720/649
(58) Field of Classification Search ................. 720/649; 361/687
See application file for complete search history.

(56) References Cited

U.S. PATENT DOCUMENTS

| 4,194,225 | A  | * | 3/1980  | Hasler ..................... 360/97.02 |
| 6,934,118 | B2 | * | 8/2005  | Hidaka et al. ............ 360/97.02 |
| 2003/0142439 | A1 | * | 7/2003  | Hidaka et al. ............ 360/97.02 |
| 2004/0145869 | A1 |   | 7/2004  | Tanaka et al. |
| 2005/0114876 | A1 | * | 5/2005  | Atarashi et al. ............. 720/649 |
| 2005/0243509 | A1 | * | 11/2005 | Fuseya et al. ............... 361/687 |
| 2006/0176665 | A1 | * | 8/2006  | Matsushima et al. ........ 361/687 |

* cited by examiner

*Primary Examiner*—Allen T Cao
(74) *Attorney, Agent, or Firm*—Townsend and Townsend and Crew LLP

(57) ABSTRACT

The disk array device (100) comprises at least one object of cooling that includes at least one of a plurality of disk type storage devices (150), and cooling parts (31U, 31L) that cool said object of cooling indirectly by means of a cooling medium.

10 Claims, 23 Drawing Sheets

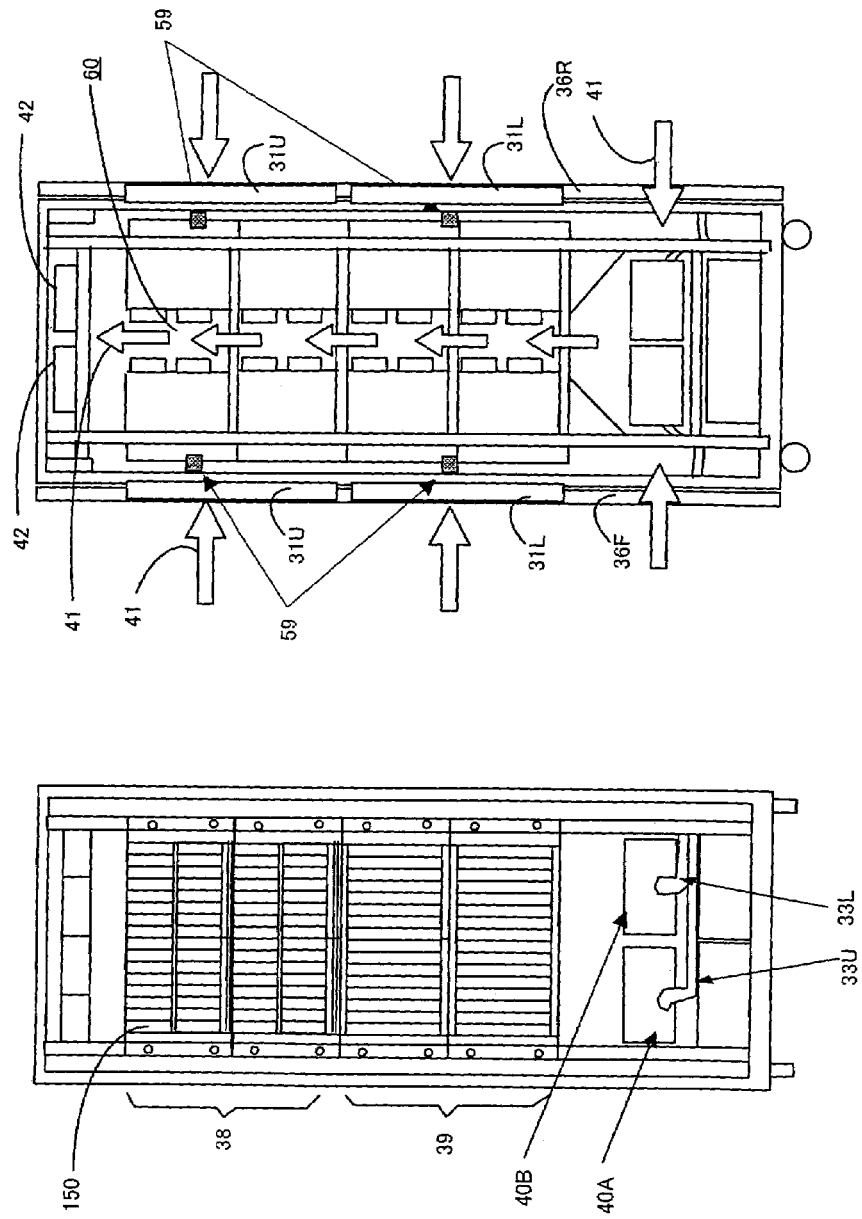

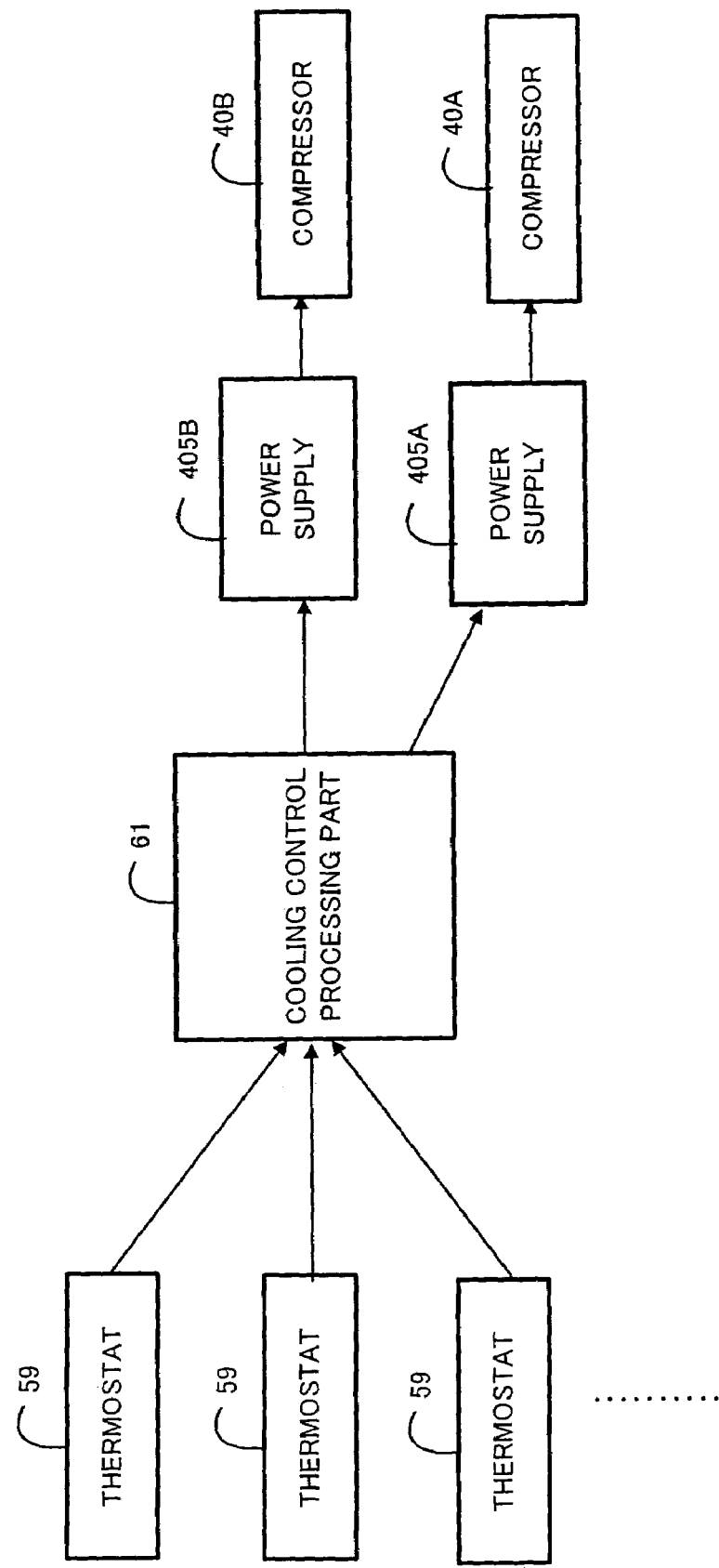

FRONT OF DEVICE

FIG.14A
FIG.14B
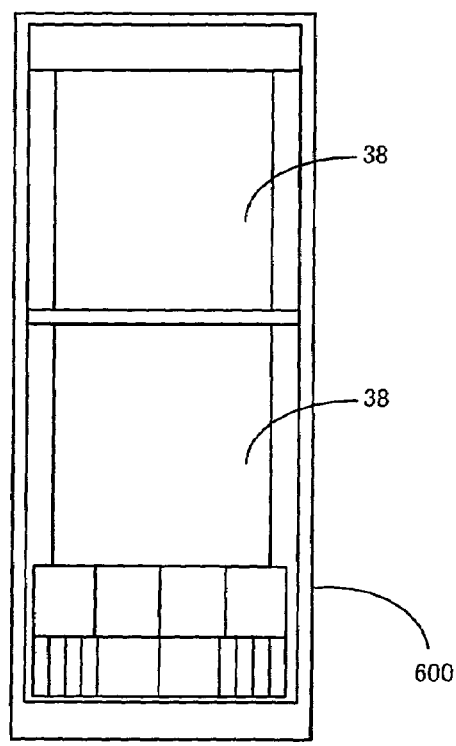
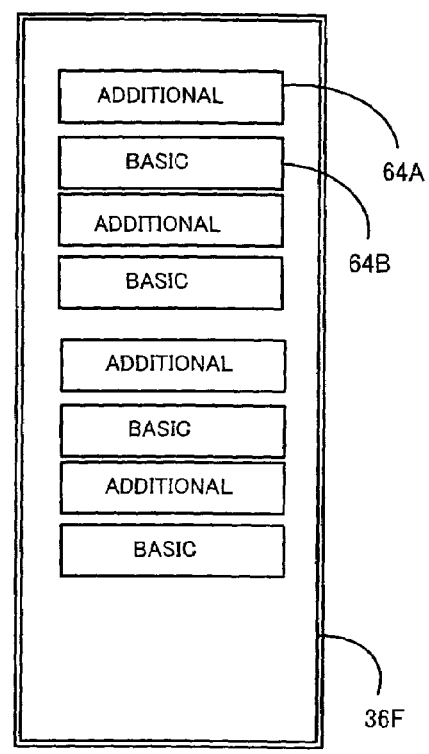

COOLING MEDIUM

COOLING MEDIUM

DISK ARRAY DEVICE AND DISK ARRAY DEVICE HOUSING

CROSS-REFERENCE TO PRIOR APPLICATION

This application relates to an claims priority from Japanese Patent Application No. 2004-352217 filed on Dec. 6, 2004, the entire disclosure of which is incorporated herein by reference.

BACKGROUND OF THE INVENTION

1. Field of the Invention

The present invention relates to a technique for cooling a disk array device.

2. Description of the Related Art

For example, large-scale disk array devices based on an RAID (redundant array of independent disks) system are known as one type of disk array device. In disk array devices of this type, cooling is accomplished by means of air cooling as disclosed for example in U.S. Patent Laid-Open No. 2004/0145869.

SUMMARY OF THE INVENTION

For example, a disk array device can be constructed by mounting a plurality of disk type storage devices (e.g., hard disk drives) and a plurality of control boards in a housing. In disk array devices, there is a demand to realize a saving of space and an increase in capacity (e.g., a large storage capacity and/or a high degree of function).

Here, the following is a problem in disk array devices from the standpoint of cooling: namely, in spite of the fact that the temperature inside the device reaches a high temperature, it is difficult to ensure a flow path for air that is used to lower the temperature inside the device.

A method in which a high-output fan is mounted in the disk array device, and the draft flowing through the interior of the disk array device is increased by means of this high-output fan, is conceivable as a method for alleviating these problems. However, in cases where a high-output fan is used, the problem of noise occurs. Furthermore, since cooling is accomplished by air cooling in the final analysis, it is important to ensure an air flow passage; however, since the problem of ensuring an air flow passage has not been solved, it is difficult to eliminate the resulting increase in the size of the disk array device.

Accordingly, it is one object of the present invention to cool a disk array device by a method other than air cooling.

Other objects of the present invention will become clear from the following description.

The disk array device according to a first aspect of the present invention comprises at least one object of cooling that includes at least one of a plurality of disk type storage devices, and a cooling part that indirectly cools this object of cooling by means of a cooling medium.

In a first embodiment of the present invention, the disk array device comprises an air intake part which takes in air that is present on the outside of the disk array device, and feeds this taken-in air into the cooling part, and the cooling part cam be disposed on the upstream side of the air with respect to the object of cooling.

In a second embodiment of the present invention, furthermore, the disk array device may further comprise a casing which accommodates the object of cooling, and a casing cover which covers the open surface of the casing. The casing cover may have a through-part that passes through the casing cover from the front surface to the back surface (various constructions such as a hole, groove or the like may be employed). The cooling part may be disposed between the back surface of the casing cover and the object of cooling. Furthermore, various constructions such as a hole, groove or the like may b employed as the through-part.

In a third embodiment of the present invention, the back surface of the casing cover may be recessed, and the cooling part may be disposed in this recessed part.

In a fourth embodiment of the present invention, the casing cover may open and close about a rotating shaft that is long in the height direction of the casing. The disk array device may comprise a cooling medium pipe through which a cooling medium passes into the cooling part, and at least a portion of the cooling medium pipe may be disposed in the vicinity of the rotating shaft.

In a fifth embodiment of the present invention, the cooling part may be a radiator.

In a sixth embodiment of the present invention, the cooling part may have a surface and comprise a cooling medium flow passage running across the entire surface, and a through-hole that allows air to pass through the surface from the front surface side to the back surface side.

In a seventh embodiment of the present invention, the disk array device may comprise a disk part on which the plurality of disk type storage devices are mounted, and a logical part on which control boards for controlling the reading and writing of data with respect to the plurality of disk type storage devices are mounted. A first cooling part used for the indirect cooling of at least one disk type storage device mounted on the disk part and a second cooling part used for the indirect cooling of at least one control board mounted on the logical part may be used in the cooling part. The first cooling part and the second cooling part may be the same.

In an eighth embodiment of the present invention, the disk array device may comprise an air intake part which takes in air that is present on the outside of the disk array device, and which feeds this taken-in air into the cooling part, the cooling part, which is disposed on the upstream side of the air with respect to the object of cooling, a temperature sensor which is disposed on the upstream side of the air with respect to the object of cooling, and on the downstream side of the cooling part, and a cooling medium temperature control part which controls the temperature of the cooling medium that is fed to the cooling part before this cooling medium reaches the cooling part, on the basis of the temperature detected by the temperature sensor.

In a ninth embodiment of the present invention, the disk array device may comprise an air intake part which takes in air that is present on the outside of the disk array device, and which feeds this taken-in air into the cooling part, an exhaust part which discharges this air to the outside of the disk array device from the cooling part via the object of cooling, a detection part which detects the number of the cooling parts that are mounted, and an exhaust control part which controls the driving of the exhaust part on the basis of the detected number of mounted cooling parts.

In a tenth embodiment of the present invention, the disk array device may comprise a plurality of cooling part mounting positions respectively corresponding to the plurality of cooling parts, a storage region which stores rule data expressing a rule for the mounting and/or removal of the cooling parts, and a mounting/removal control part which selects a cooling part mounting position from the plurality of cooling part mounting positions on the basis of the rule data stored in the storage region, and which instructs a user to mount or remove the cooling part with respect to the selected cooling part mounting position.

In an eleventh embodiment of the present invention, the disk array device may comprise a mounting detection part which detects the mounting of objects of cooling in mounting regions in which N objects of cooling can be mounted, and a cooling part mounting control part which instructs a user to mount cooling parts in places corresponding to the mounting regions prior to the detection of the mounting of N objects of cooling in the mounting regions.

In a twelfth embodiment of the present invention, the cooling part may have a surface and comprise a cooling medium flow passage tube running across the entire surface, and a through-hole that allows air to pass through the surface from the front surface side to the back surface side. The disk array device may comprise an opening and closing part that opens and closes the through-hole of the cooling part, and an opening and closing control part that controls the opening and closing of the opening and closing part of the cooling part on the basis of specified information.

In a thirteenth embodiment of the present invention, the specified information may be at least one type of information selected from the following types of information (1) through (3): (1) the number of mounted cooling parts, (2) the positions in which the objects of cooling are mounted, and (3) the current temperature in the disk array device.

In a fourteenth embodiment of the present invention, the object of cooling may be a control board. The control board may be mounted on the disk array device in a state in which the surfaces of the control board are upright. The cooling part may be mounted in a position that is lower than the control board. The disk array device may comprise an air intake part which takes in air that is present on the outside of the disk array device, and which feeds this taken-in air into the cooling part, and an air rising part which causes the air from the cooling part to rise along the surfaces of the control board.

In a fifteenth embodiment of the present invention, the disk array device may comprise a compressor which feeds a cooling medium into the cooling part. The compressor may be disposed in a higher position than the object of cooling.

The housing according to a second aspect of the present invention may comprise a casing that accommodates an object of cooling including at least one of a plurality disk type storage devices disposed in the disk array device, and a casing cover that covers the open surface of the casing. The casing cover may have a through-part that passes through the casing cover from the front surface to the back surface. A cooling part installation part used to install a cooling part that cools the object of cooling indirectly by means of a cooling medium may be disposed on the back surface of the casing cover.

BRIEF DESCRIPTION OF THE DRAWINGS

FIG. 5A shows the external appearance of the front surface of the casing 35 on which constituent element such as the disk part 38 and the like are mounted;

FIG. 5B shows the external appearance of the side surface of the casing 35 in FIG. 5A;

FIG. 6 shows an example of the functional construction that is used to control the driving of the compressor;

FIG. 14A shows a front view of a disk array device constituting a third embodiment of the present invention;

FIG. 14B shows an example of the disposition of the radiator in this third embodiment;

DESCRIPTION OF THE PREFERRED EMBODIMENTS

Several embodiments of the present invention will be described below with reference to the attached figures.

Embodiment 1

Figure 1:
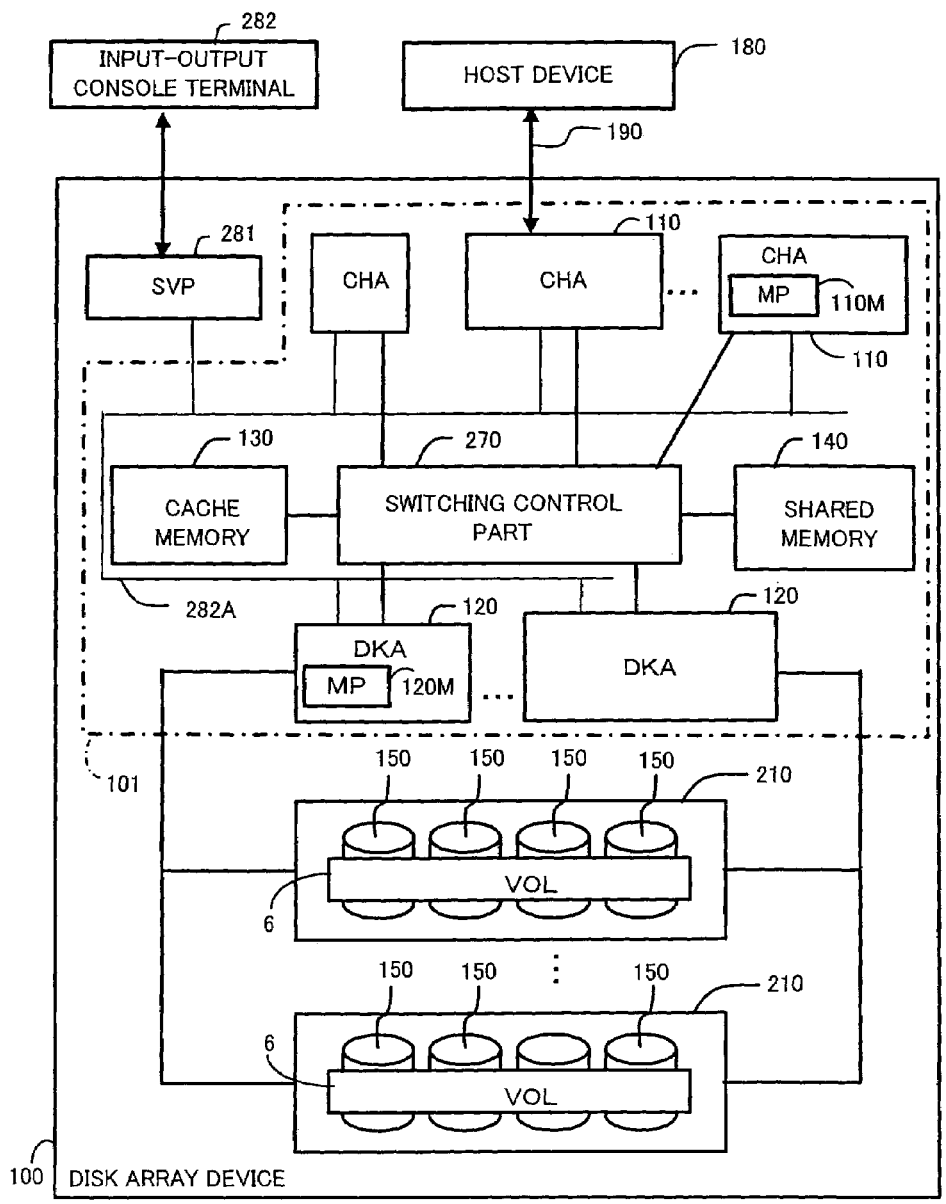
FIG. 1 shows an example of the construction of a disk array device constituting a first embodiment of the present invention.

FIG. 1 shows an example of the construction of a disk array device constituting a first embodiment of the present invention.

For instance, the disk array device 100 is a storage control device which performs storage control based on an RAID (redundant array of independent disks) system. For example, the disk array device 100 comprises a control part 101 that controls the processing performed by the disk array device 100, an RAID group 210, and a service processor (SVP) 281. For example, the control part 101 comprises one or a plurality of disk adapters (hereafter referred to as DKAs) 120, one or a plurality of channel adapters (hereafter referred to as CHAs) 110, a cache memory 130, a shared memory 140 and a switching control part 270.

The RAID group 210 includes a plurality of disk type storage devices 150, and provides redundant memory based on RAIDs such as (for example) the RAID 1, RAID 5 and the like. For example, the respective disk type storage devices 150 may be hard disk drives themselves, or may be devices comprising hard disk drives in canisters (not shown in the figures). One or more logical volumes (hereafter referred to as "VOLs") 6 constituting logical storage regions can be set in the physical storage region provided by each disk type storage device 150. A plurality of sets of data transmitted from the host devices 180 can be stored in the VOLs 6.

The respective DKAs 120 control the exchange of data with the respective disk type storage devices 150. For example, each DKA 120 is constructed as a micro-computer system containing a microprocessor (hereafter referred to as an "MP") 120M, ROM, RAM and the like. For example, a plurality of DKAs 120 are disposed inside the disk array device 100. For example, the transfer control part 3 performs data transfer at the block level with the disk type storage devices 150 on the basis of SCSI, iSCSI or the like.

The respective CHAs 110 receive data from the host devices 180 via a connection bus 190. The connection bus 190 may be a communications network or a dedicated bus line. Like the DKAs 120, the respective CHAs 110 can be constructed as micro-computer systems. For example, the respective CHAs 110 comprise an MP 110M, a DMA controller 113 and a transfer control part 111.

For example, the cache memory (hereafter referred to as "CM" in some cases) 130 can be constructed from a volatile or nonvolatile semiconductor memory. The cache memory 130 can store data from the host devices 180 and data that is read out from the VOLs 6.

For example, the shared memory (hereafter referred to as "SM" in some cases) 140 can be constructed from a nonvolatile or volatile semiconductor memory. For instance, the shared memory 140 stores various types of commands received from the host devices 180, control information used in the control of the disk array device 100 and the like. The commands, control information and the like may also be redundantly stored by a plurality of shared memories 140. Furthermore, the cache memory 130 and shared memory 140 can be constructed as respectively separate memories, or one portion of a memory can be used as a cache memory region, and another portion of the same memory can be used as a shared memory region.

The switching control part 270 respectively connects the respective DKAs 120, the respective CHAs 110, the cache memory 130 and the shared memory 140 to each other. For example, the switching control part 270 can be constructed from an ultra-high-speed cross bar switch or the like.

For example, the SVP (service processor) 281 collects and monitors the states of the respective parts inside the disk array device 100 via an internal network (e.g., an LAN) 282. The SVP 281 outputs information relating to the collected internal state to an external control terminal (not shown in the figures) as raw data, or as data that has been subjected to tabulation processing. Examples of information that can be collected by the SVP 281 include device constructions, power supply alarms, temperature alarms, input-output rates (in units of (for example) IOPS (IO requests per second)) and the like. The system manager can perform alterations in the setting of the RAID construction, closing processing of various types of packages (e.g., CHAs 110 and DKAs 120) and the like from the control terminal (not shown in the figures) via the SVP 281. Furthermore, the SVP 281 can receive the input of information from an input-output console terminal (e.g., a personal computer) 282, and can store input information in a specified storage region (e.g., memory) of its own, or can display specified information on the input-output console terminal 282.

Next, one example of the processing performed by the disk array device 100 will be described. The CHAs 110 receive write commands and data from the host devices 180 via the connection bus 190. The received write commands are stored in the shared memory 140, and the received data is stored in the cache memory 130. The DKAs 120 occasionally refer to the shared memory 140. When the DKAs 120 discover unprocessed write commands stored in the shared memory 140, the DKAs 120 read out data from the cache memory 130, and perform address conversion and the like. The DKAs 120 write the data into the respective disk type storage devices 150 that constitute the VOLs 6 designated by the write commands.

A case in which read commands from the host devices 180 are processed will be described. When the CHAs 110 receive read commands from the host devices 180, these read commands are stored in the shared memory 140. When the DKAs 120 discover unprocessed read commands in the shared memory 140, the DKAs 120 read out data from the respective disk type storage devices 150 constituting the VOLs 6 designated by these read commands. The DKAs 120 store the read-out data in the cache memory 130. Furthermore, the DKAs 120 notify the CHAs 110 (via the shared memory 140) that the read-out of the requested data has been completed. The CHAs 110 read in the data from the cache memory 130, and transmit this data to the host device 180.

The above is an example of the construction of the disk array device 100 in the present embodiment. Furthermore, it goes without saying that the disk array device 100 is not necessarily limited to the abovementioned construction. For example, the disk array device 100 may also be constructed from a memory that can store control information, data and the like, an interface device (hereafter abbreviated to "I/F") for the host devices 180, an I/F for the disk type storage devices 150, and a control part (e.g., a CPU) that controls communications and the like on the basis of the information in the memory via the I/Fs.

In this first embodiment, a disk array device 100 such as that described above can be constructed by mounting the various constituent elements such as the disk type storage devices 150, CHAs 110 and the like in a housing. Furthermore, effective cooling of the disk array device 100 and a contribution to a reduction in the size of the disk array device 100 can be realized by mounting a radiator in the disk array device 100 by the method described below. This will be described in detail below.

Figure 2:
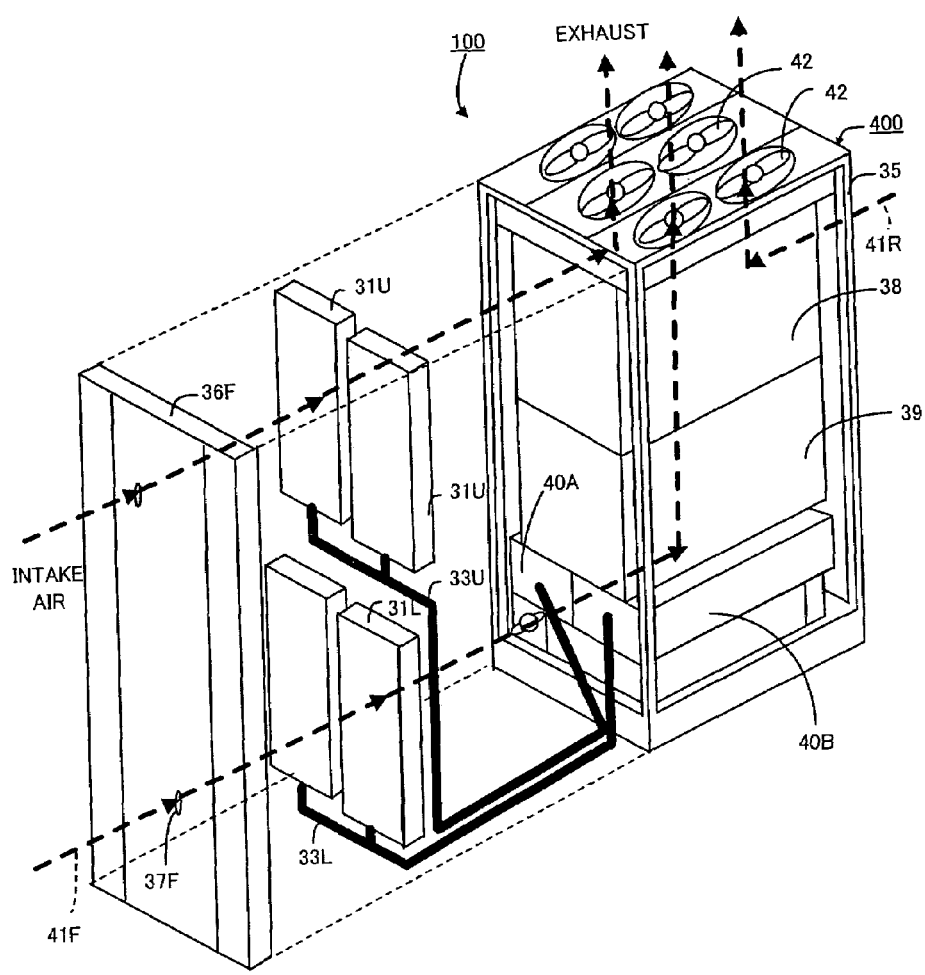
FIG. 2 shows an exploded view of the disk array device 100.

FIG. 2 shows an exploded view of the disk array device 100.

The housing 400 that is used to realize the disk array device 100 has a casing 35, a front cover 43F that covers the front surface of the casing 35, and a rear cover (not shown in the figures) that covers the back surface of the casing 35. Furthermore, in this figure, the side surface of the casing 35 is removed in order to facilitate viewing of the internal construction of the casing 35. However, the side surface of the casing 35 can be covered by a wall that can be opened and closed, or a wall that is immobile.

The physical disposition relationship of the respective constituent elements of the disk array device 100 can be made a symmetrical relationship (e.g., a relationship showing linear symmetry or point symmetry) between the front surface side and back surface side, with the center (substantially or completely) of the casing 35 as a boundary. Accordingly, if the construction on the front surface side is described in detail, the construction on the back surface side can also be understood. The description of the construction of the disk array device 100 will be continued below; in the following description, mainly the construction on the front surface side will be described.

A disk part 38 and a logical part 39 are accommodate in the casing 35. In this embodiment, the logical part 39 is positioned beneath the disk part 38.

A disk casing (not shown in the figures) which holds disk type storage devices 150 that are inserted from both the front surface and back surface is disposed in the disk part 38. A connector to which the disk type storage devices 150 are connected, and a disk mounting/removal signal output part (not shown in the figures) which outputs a signal indicating that a disk type storage device 150 has been connected to or removed from the this connector, are disposed inside the disk part 38.

A circuit board casing (not shown in the figures) which holds circuit boards that are inserted from both the front surface and back surface is disposed in the logical part 39. In the present embodiment, the term circuit board refers to at least one of the following: namely, a CHA 110, DKA 120, cache memory (hereafter referred to as "CM" in some cases) 130 and shared memory (hereafter referred to as "SM" in some cases) 140. A connector to which the circuit boards are connected, and a circuit board connection/removal signal output part (not shown in the figures) which outputs a signal indicating that a circuit board has been connected to or removed from the this connector, are disposed inside the logical part 39.

The mounting or removal of disk type storage devices 150 with respect to the disk part 38 inside the casing 35, and the mounting or removal of circuit boards with respect to the logical part 38 can be accomplished by opening the front cover 36F. Substantially the entire area of the front surface of the casing 35 can be covered by closing the front cover 36F.

A mechanism which draws in air 41F from the front surface of the casing 35 and feeds this air toward the back surface is disposed in the casing 35. On example of the construction of this mechanism is a through-hole 37F which passes through the casing 35 from the front surface to the back surface as shown in the figures. As a result, air 41F is drawn into the through-hole 37F of the casing 35 from the front surface, and this air 41F is fed toward the back surface from the through-hole 37F. This air 41F further advances to the vicinity of the center of the casing 35, and is fed upward into the casing 35 from the vicinity of the center of the casing 35; this air 41F is then discharged from the upper surface of the casing 35 via an exhaust fan 42 that is disposed on the upper surface of the casing 35. Such a flow of the air 41F is created by the through-hole 37F and exhaust fan 42. For example, a plurality of through-holes 37F can be disposed across all or part of a specified region of the front cover 36F. Furthermore, one or a plurality of exhaust fans 42 may also be installed.

In this first embodiment, radiators 31U and 31L are mounted between the back surface of the front cover 36F and the respective front surfaces of the disk part 38 and logical part 39 in order to lower the temperature of the air 41F that is drawn in from the front cover 36F and feed this air with a lowered temperature into the interior of the casing 35. The radiators 31U and 31L have a front surface into which the air 41F enters, and a back surface from which the air 41F leaves; these radiators are constructed so that the temperature of the air 41F from the front surface is lowered by means of a cooling medium, and so that this air 41F with a lowered temperature exits from the back surface. In other words, as a result of the interposition of the radiators 31U and 31L between the back surface of the front cover 36F and the various objects of cooling, the objects of cooling are indirectly cooled by the abovementioned cooling medium.

In the field of servers and personal computers, cooling methods in which objects of cooling (e.g., heat generating parts such as CPUs and the like) are directly cooled by water cooling are sometimes employed. However, such cooling methods cannot be simply applied to disk array devices. One of the reasons for this is in a disk array device, the installation and removal of objects of cooling is performed with the power supply on. In other words, hot swapping (live wire insertion) is performed.

Accordingly, in the present embodiment, indirect cooling by means of the cooling medium of the radiators 31U and 31L is performed by interposing these radiators 31U and 31L between the front cover 36F and the objects of cooling. Furthermore, a fluid (e.g., a liquid or gas) can be used as the cooling medium. In concrete terms, for example, water or Freon (HFC-R410A (hydrofluorocarbon (also called substitute Freon or new cooling medium HFC in some cases))) can be used.

Various variations are conceivable in the method used to mount the radiators 31U and 31L (e.g., the mounting position). In this FIG. 2, for example, one or a plurality of radiators 31U are mounted in positions facing in the directions of the front and back surfaces corresponding to the plurality of disk type storage devices 150 mounted in the disk part 38. Furthermore, one or a plurality of radiators 31L are mounted in positions facing in the directions of the front and back surfaces corresponding to the plurality of circuit boards mounted in the logical part 39. The plurality of radiators 31U and 31L (e.g., the sizes and/or constructions of the radiators) may be completely identical, or may vary according to the sizes and/or constructions of the objects of cooling. In concrete terms, for example, if one or more dimensions among the height, width and depth of the disk array device 100 (e.g., the height and width) are determined on the basis of s specified standard (e.g., EIA (Electronic Industries Alliance) standard), then one or more dimensions among the height, width and depth of the radiators 31U and 31L may be set as dimensions corresponding to these. More concretely, for example, the width of the radiators 31U and 31L may be set at substantially half of the width of the front cover 36F.

Compressors 40A and 40B are connected to the radiators 31U and 31L via cooling medium pipes 33U and 33L that are used to cause the flow of a cooling medium to the radiator 31.

For example, the compressors 40A and 40B may also function as cooling medium sources that feed out a cooling medium. The compressors 40A and 40B perform a cooling medium circulation treatment. For example, the compressors 40A and 40B cause the cooling medium to flow to the radiators 31U and 31L via the cooling medium pipes 33U and 33L, and receive the cooling medium whose temperature has been elevated by heat exchange performed in the radiators 31U and 31L via the cooling medium pipes 33U and 33L. The temperature of this cooling medium is lowered, and the cooling medium is again caused to flow to the radiators 31U and 31L via the cooling medium pipes 33U and 33L.

Figure 3A:
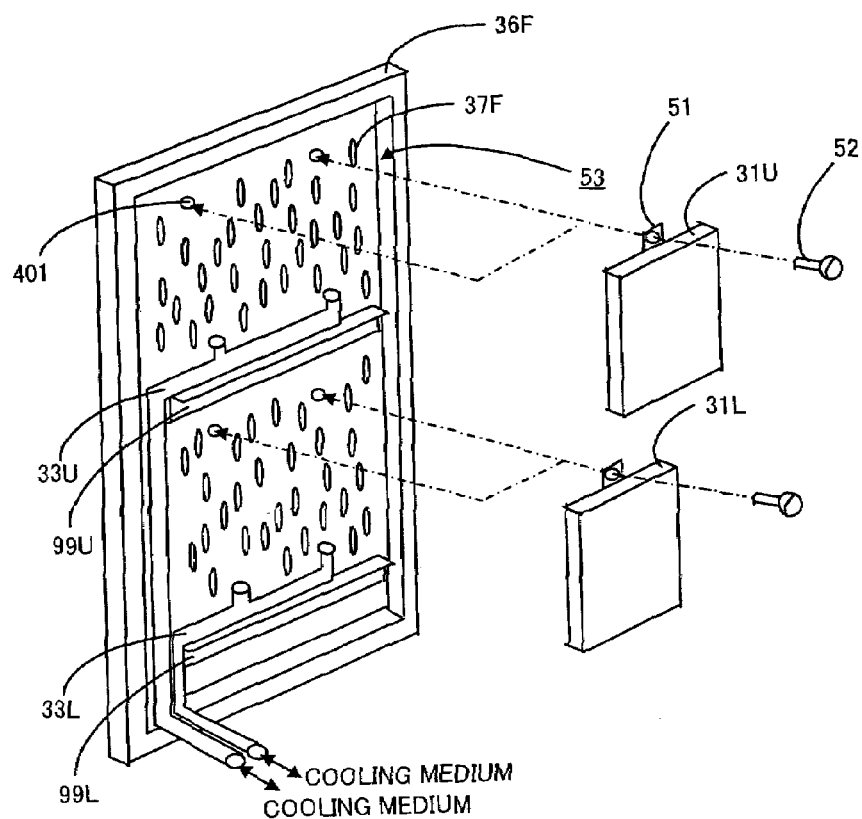
FIG. 3A shows an example of the external appearance of the back surface of the front cover.

FIG. 3A shows an example of the external appearance of the back surface of the front cover.

As was described above, a plurality of through-holes 37F are formed in the front cover 36F. Shelves 99U and 99L that are respectively used to carry the cooling medium pipes 33U and 33L are disposed on the back surface of the front cover 36F. As is shown in FIG. 3A, portions of the cooling medium pipes 33U and 33L are carried on the shelves 99U and 99L.

Furthermore, supporting holes (e.g., screw holes) 401 which are used to support the radiators 31U and 31L are disposed in the back surface of the front cover 36F in positions where the radiators 31U and 31L can be set. Cut pieces 51 are formed in the upper surfaces of the radiators 31U and 31L. The radiators 31U and 31L can be fastened to the back surface of the front cover 36F by inserting fastening members (e.g., screws) 52 into the supporting holes 401 via these cut pieces 51.

Furthermore, a specified area (e.g., substantially the entire area) of the back surface of the front cover 36F is recessed to a specified depth. In other words, the front cover 36F can be expressed as a vessel with a shallow depth. The radiators 31U and 31L are inserted into the recess 53 of the front cover 36F. As a result, the overall thickness of the front cover 36F to which the radiators 31U and 31L are fastened can be reduced. Furthermore, the relationship between the depth D1 of the front cover 36F and the thickness (depth) D2 of the radiators 31U and 31L may be any desired relationship (in other words, this relationship may be D1≦D2, D1≧D2 or D2<D1).

Figure 3B:
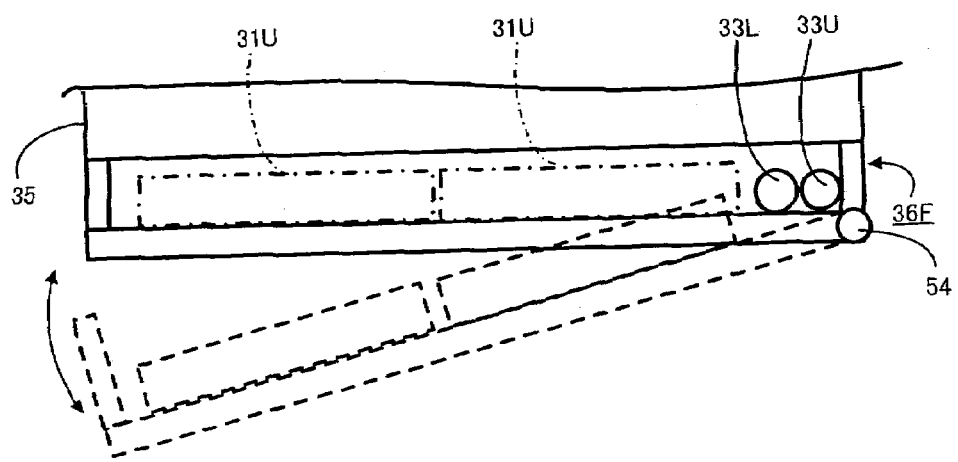
FIG. 3B shows the cross-sectional construction of front cover 36F, and one example of the opening and closing structure of the front cover 36F.

FIG. 3B shows one example of the cross-sectional construction of the front cover 36F and the opening and closing structure of the front cover 36F.

The front cover 36F opens and closes about a rotating shaft 54. Portions of the cooling medium pipes 33U and 33L (the portions on the downstream side of the cooling medium that flows from the radiators 31U and 31L to the compressors 40A and 40B (the upstream sides are carried on the shelves 99U and 99L)) are gathered in the vicinity of the rotating shaft 54. As a result, movement of the cooling medium pipes 33U and 33L when the front cover 36F is opened and closed can be suppressed. Furthermore, all parts of the cooling medium pipes 33U and 33L may be made of the same material (e.g., a hard material such as a metal or the like, or a flexible material such as rubber or the like), or certain portions of these pipes may be made of a different material (e.g., certain portions may be made of a metal while other portions are made of rubber).

Figure 4A:
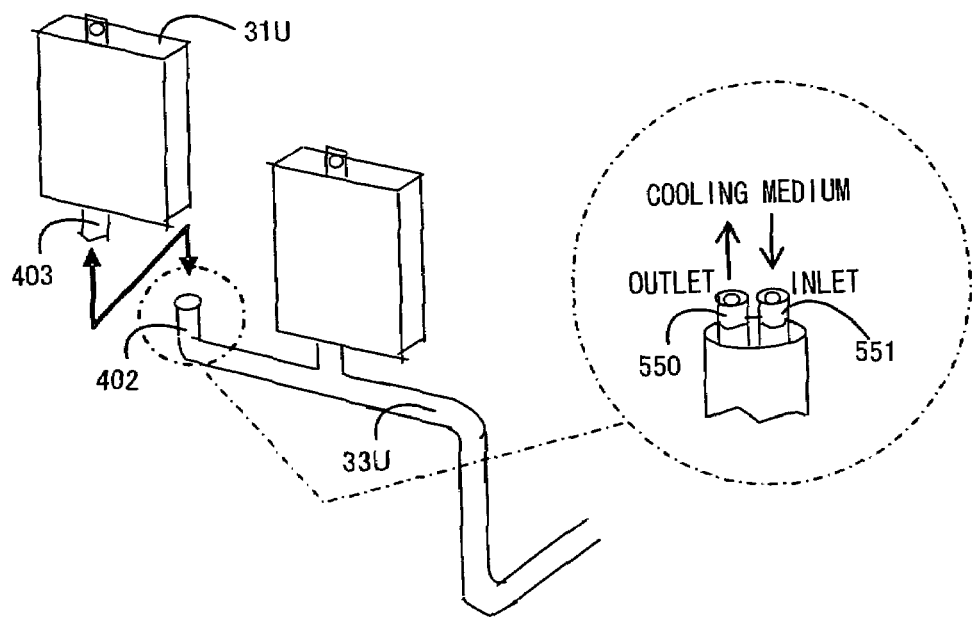
FIG. 4A shows an example of the connection of the radiator 31U and the cooling medium pipe 33U.
Figure 4B:
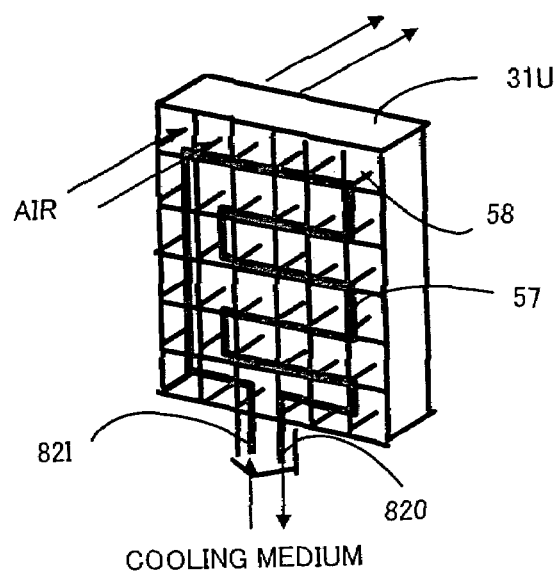
FIG. 4B shows an example of the construction of the radiator 31U.

FIG. 4A shows an example of the connection between the radiator 31U and the cooling medium pipe 33U. FIG. 4B shows an example of the construction of the radiator 31U. Furthermore, the example of connection shown in FIG. 4A and the example of construction shown in FIG. 4B may also be applied to the radiator 31L.

As is shown in FIG. 4A, a connection opening 403 that connects with the cooling medium pipe 33U extends from the undersurface of the radiator 31U. As is shown in FIG. 4B, the connection opening 403 has a cooling medium inlet port 82I, and a cooling medium outlet port 82O. The connection opening 403 is connected to the tip end of a branch pipe 402 of the cooling medium pipe 33U.

A cooling medium outlet port 55O and a cooling medium inlet port 55I are disposed on the tip end of the branch pipe 402. Accordingly, the cooling medium inlet port 82I of the radiator 31U is connected to the cooling medium outlet port 55O, and the cooling medium outlet port 82O of the radiator 31U is connected to the cooling medium inlet port 55I. As a result, the cooling medium that leaves the compressor 40A advances into the radiator 31U via the outlet port 55O of the branch pipe 402 of the cooling medium pipe 33U and the cooling medium inlet port 82I of the radiator 31U. Furthermore, the cooling medium that leaves the radiator 31U passes through the cooling medium outlet port 82O of the radiator 31U and the inlet port 55I of the branch pipe 402 of the cooling medium pipe 33U, and enters the compressor 40A via the cooling medium pipe 33U.

The radiator 31U and the branch pipe 402 of the cooling medium pipe 33U can be connected by various methods, e.g., a simple joint system or the like.

As is shown in FIG. 4B, for example, a cooling medium flow passage pipe 57 which has a cooling medium inlet port 81I and an outlet port 82O, and an air passage port 58 which used to allow the passage of air from the front surface to the back surface, are disposed in the radiator 31U.

For example, the cooling medium flow passage pipe 57 is disposed on the front surface of the radiator 31U (or inside the radiator 31U or on the back surface of the radiator 31U). The cooling medium flow passage pipe 57 is made of a material with a high thermal conductivity (e.g., a metallic material such as copper or the like. For example, the cooling medium flow passage pipe 57 is constructed so that the cooling medium can flow through the radiator 31U at some length in terms of distance (or in terms of time). In concrete terms, for example, the cooling medium flow passage pipe 57 is mounted in a meandering form throughout substantially the entire region of the radiator 31U.

A plurality of air passage ports 58 are disposed. For example, these air passage ports 58 can be realized by means of cooling fins. For instance, these cooling fins have a honeycomb structure. The cooling fins and the cooling medium flow passage pipe 57 can be formed into an integrated structure by welding or the like.

FIG. 5A shows the external appearance of the front surface of the casing 35 in which the constituent elements such as the disk part 38 and the like are mounted. FIG. 5B shows the external appearance of the side surface of the casing 35 shown in FIG. 5A.

In the disk array device 100 of the present embodiment, air 41 enters and advances to the vicinity of the center from the outside of the front cover 36F that closes the front surface of the casing 35 and the rear cover 36R that closes the back surface of the casing 35 vi the front cover 36F and rear cover 36R. In this case, the air that is cooled by the radiators 31U and 31L that are respectively mounted on the front cover 36F and rear cover 36R moves to the vicinity of the center. Furthermore, the air 41 that reaches the vicinity of the center passes through a central duct 60 that is long in the vertical direction in substantially the center of the casing 35, and is discharged from the exhaust fan 42.

The objects of cooling such as the disk type storage devices 150, circuit boards and the like are cooled by the air 41 that is cooled by the radiators 31U and 31L; here, a thermostat 59 is mounted on the upstream side of the air with respect to the objects of cooling. For example, the thermostat 59 is disposed on the back surface side of the radiators 31U and 31L (in other words, on the downstream side of the flow passage of the air 41). For instance, one thermostat 59 is mounted for each radiator. The driving of the compressors 40A and 40B is controlled according to the temperature detected by the thermostats 59.

FIG. 6 shows an example of the functional construction that is used to control the driving of the compressors.

Power supplies 405A and 405B for the compressors 40A and 40B are mounted on th4 compressors 40A and 40B. In a case where the power supplies 405A and 405B are in an "on" state, the compressors 40A and 40B cool the returning cooling medium, and then discharge the cooling medium. However, in a case where the power supplies 405A and 405B are in an "off" state, the compressors discharge the returning cooling medium without cooling this cooling medium.

A cooling control processing part 61 is connected to the power supplies 405A and 405B. For example, the cooling control processing part 61 constitutes switches for the power supplies 405A and 405B, and respective thermostats 59 are connected.

As a result of this construction, for example, the following type of control is performed. Specifically, in cases where the respective thermostats 59 detect that the temperature of the air that has passed through the radiator 31U (or 31L) exceeds a specified temperature (e.g., 25 degrees), the thermostats output a signal of a specified level, while in cases where this is not so, the thermostats do not output this signal of a specified level.

In cases where the cooling control processing part 61 receives a signal of a specified level from a given thermostat 59, the cooling control processing part 61 turns on the switch of the power supply corresponding to the compressor (e.g., 40B) corresponding to this thermostat, i.e., the power supply corresponding to the compressor corresponding to the radiator that has discharged air at a temperature higher than a specified temperature, while in cases where this is not so, the cooling control processing part 61 does not turn on the switch of this power supply.

As a result of such control being performed, the temperature of the air that flows toward the objects of cooling from the radiators 31U and 31L can be kept at a specified temperature or lower (e.g., 25 degrees or lower).

Furthermore, the cooling control method is not limited to the method described with reference to FIG. 6; various methods may be used. For example, in cases where a separate specified temperature that is lower than the abovementioned specified temperature is set, and the thermostat 59 detects a temperature that is lower than this separate specified temperature, this means that the air has been excessively cooled; accordingly, a signal that is used to turn off the power supply of the compressor may be output to the cooling control processing part 61. In this case, the power supply of the compressor corresponding to the thermostat 59 that output the signal is turned off by the cooling control processing part 61.

In this first embodiment, for example, the mounting or removal of the radiators can be controlled by the method described below.

Figure 7:
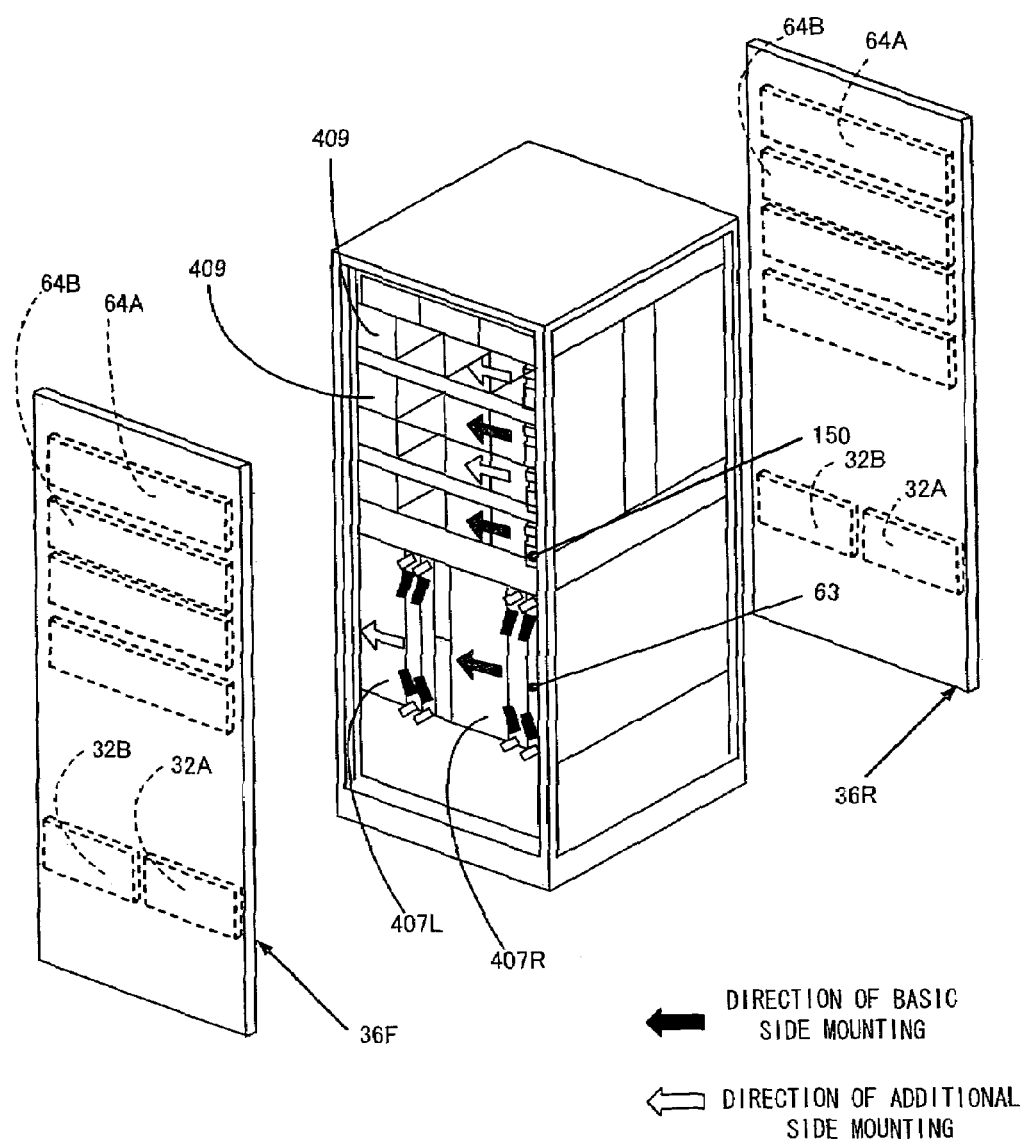
FIG. 7 shows one example of the relationship between the method used to mount the object of cooling and the mounting position of the radiator based on the mounting position of the object of cooling.

FIG. 7 shows one example of the relationship between the method used to mount the objects of cooling and the mounting positions of the radiators based on the mounting positions of the objects of cooling.

The disk part 38 has a plurality of rows (long columns oriented in the lateral direction) 409 oriented along the direction in which the disk type storage devices 150 are disposed. In the initial stage, disk type storage devices 150 are mounted in the even-numbered rows 409, and in stages later than the initial stage (e.g., stages in which the user desires to add disk type storage devices, and adds such devices), disk type storage devices 150 are mounted in the odd-numbered rows 409. In the respective rows, the disk type storage devices 150 are mounted facing from left to right toward the front surface of the casing 35.

The logical part 39 has a right side region 407R and a left side region 407L. The right side region 407R is a region in which circuit boards 63 are mounted in the initial stage, and the left side region 407L is a region in which circuit boards 63 are mounted in stages that are later than the initial stage. For example, the circuit boards 63 are also mounted from right to left.

The method used to mount the objects of cooling is as described above. Accordingly, on the front cover 36F and rear cover 36R, radiators 64B and 32B are mounted in regions (hereafter referred to as board regions) corresponding to the objects of cooling mounted in the initial stage, and radiators 64A and 32A are mounted in regions (hereafter referred to as additional regions) corresponding to objects of cooling that are mounted in stages later than the initial stage. For example, the width of the radiators 64A and 64B is the same as the length of the respective rows 409 of the disk part 38, and the width of the radiators 32A and 32B is substantially the same as width of the right side region 407R and left side region 407L of the logical part 39. Furthermore, the areas of the radiators 64A and 64B may be substantially the same as the areas of the respective rows 409 of the disk part 38; similarly, the areas of the radiators 32A and 32B may be substantially the same as the areas of the right side region 407R and left side region 407L of the logical part 39. In this FIG. 7, for example, the height of the radiators 32A and 32B is approximately half the height of the right side region 407R and left side region 407L of the logical part 39.

The size of the respective radiators shown in this FIG. 7 differs from the size of the radiators shown in FIG. 2; nevertheless, the content of the first embodiment can be sufficiently grasped. The width of the radiators 64A and 64B shown in this FIG. 7 is substantially the same as the length of the respective rows of the disk part 38; however, a function that is substantially the same as that of the radiators 64A and 64B can be manifested by (for example) by lining up two radiators (having half the width) in the lateral direction.

Figure 8:
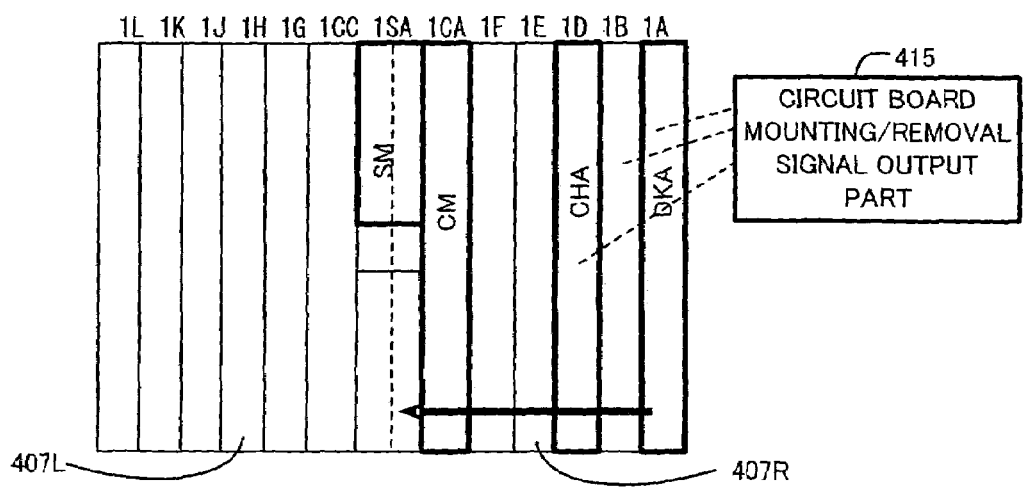
FIG. 8 is a diagram which shows one example of the order of mounting of the circuit boards.

FIG. 8 is a diagram showing one example of the mounting order of the circuit boards.

In this figure, a plurality of circuit board mounting positions are respectively present in right side region 407R and left side region 407L of the logical part 39. Addresses ("1A", "1B", . . . in FIG. 8) are assigned to the respective positions. Furthermore, respective circuit board mounting/removal signal output parts 415 that are associated with the respective positions are provided. As a result, for example, in cases where a DKA 120 is mounted in the location of the address "1A", a signal is output from the circuit board mounting/removal signal output part 415 corresponding to the location of the address "1A" by mean of, for example, the contact between the connector of the DKA 120 and the connector of the logical part 39.

A construction in which signal output parts with addresses assigned to respective mounting positions are installed is not particularly shown in the figures; however, this can also be applied to the disk part 38.

Figure 9:
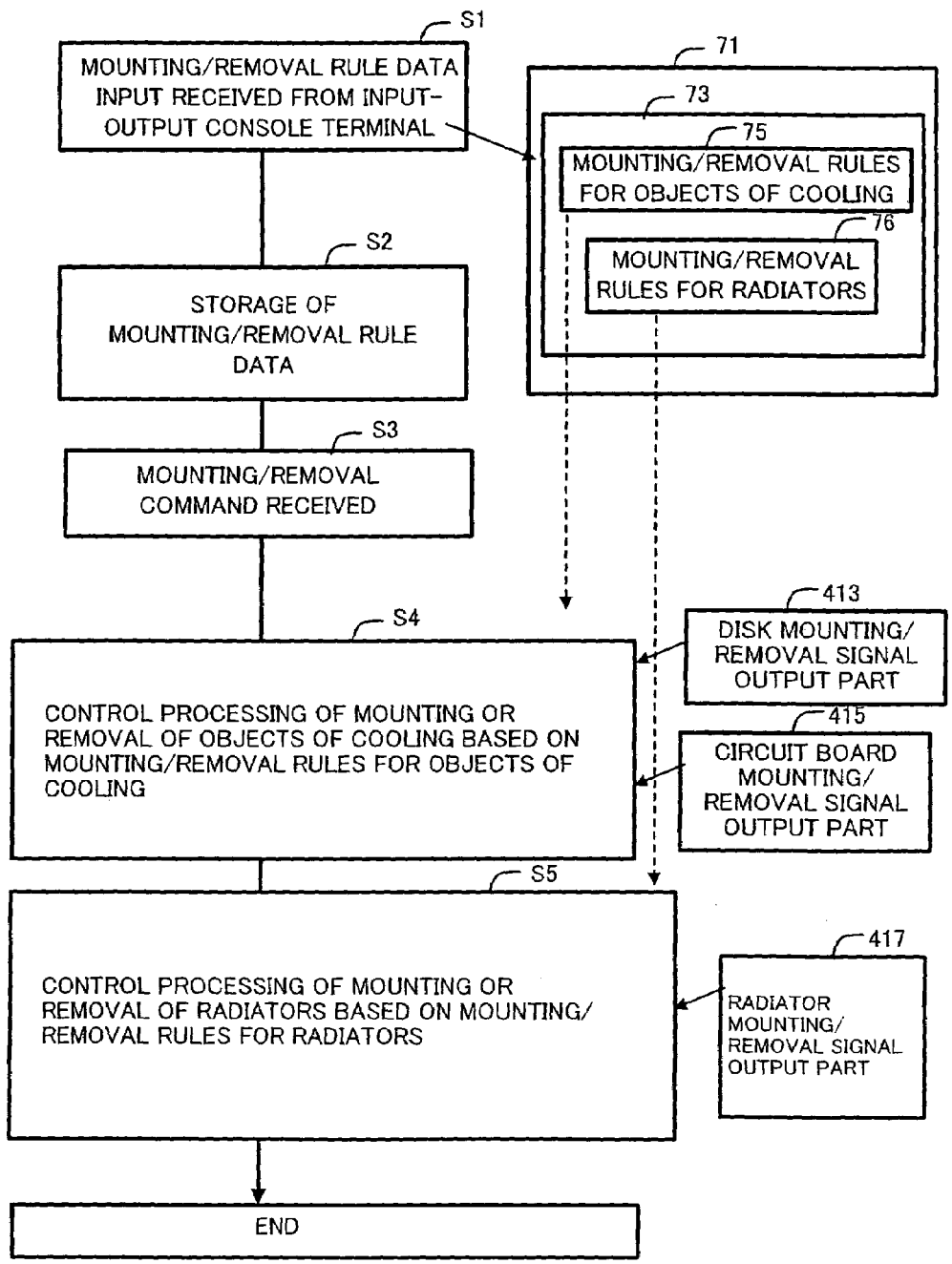
FIG. 9 shows one example of the flow of the control processing of the mounting or removal of the object of cooling and the radiator.

FIG. 9 shows one example of the flow of the control processing of mounting or removal the objects of cooling and radiators.

For example, the processing shown in this figure can be executed by the SVP 281 (see FIG. 1). This processing may also be executed by another processor (e.g., the MP 110M or 120M mounted in a CHA 110 or DKA 120) instead of the SVP 281. In the following description, the main body executing this processing will be the SVP.

The SVP 281 has a storage region 71 (e.g., memory or hard disk). Mounting/removal rule data 73 is input into the SVP 281 from an input-output console terminal 282 (step S1), and the input data 73 is stored in the storage region 71 of the SVP 281 (S2).

For example, rules 75 for the mounting and/or removal of objects of cooling (e.g., disk type storage devices 150), and rules 76 for the mounting and/or removal of radiators, are recorded in the mounting/removal rule data 75.

For example, the mounting/removal rules 75 for objects of cooling are rules that indicate which circuit boards are to be mounted in or removed from which positions in what order. For example, these rules 75 may be prepared for each machine type of the disk array device 100. Furthermore, in cases where the objects of cooling are disk type storage devices 150, for example, the mounting/removal rules for the disk type storage devices may be prepared according to specified criteria such as the RAID level or the like. In concrete terms, for example, the rules for the disk type storage devices 150 may be determined on the basis of the RAID group construction (e.g., 3D+1P (3 disks+1 parity), 7D+1P (7 disks+1 parity)) or the like.

The rules for the mounting and/or removal of the radiators are rules that indicate which radiators are mounted in or removed from which positions in which cases. For example, a rule indicating that "radiators are mounted in positions corresponding to the right side region 407R in cases where it is detected that specified circuit boards have all been mounted in the right side region 407R of the logical part 39" can be used as one of these rules 76. For example, in the case of the radiator mounting positions as in the case of the circuit board mounting positions, the respective radiator mounting positions can be discriminated by the SVP 281 by assigning addresses. Furthermore, in the disk array device 100, for example, a radiator mounting/removal signal output part 417 can be disposed in the radiator mounting locations in the front cover 36F or the like. The SVP 281 can detect the locations in which radiators have been mounted by the reception of signals from this radiator mounting/removal signal output part 417 by the SVP 281 (or by some other circuit). For example, such signals are automatically output in cases where radiators are connected to specified connecting parts.

In cases where the user mounts and/or removes an object of cooling and/or a radiator, for example, the user sends a command indicating the gist [of this operation] (hereafter referred to as a "mounting/removal command") to the SVP 281 by operating (for example) the input-output console terminal 282, and performs the mounting and/or removal of the object of cooling and/or radiator in accordance with instructions from the SVP 281 that responds to this.

In cases where the SVP 281 receives a mounting/removal command (S3), for example, the SVP 281 reads out the mounting/removal rules 75 for objects of cooling, and executes mounting or removal control processing based on these rules 75 (S4). For example, this processing can be performed on the basis of the signals from the disk mounting/removal signal output part 413 or circuit board mounting/removal signal output part 415, which output specified signals when the mounting or removal of an object of cooling is performed. For instance, if the SVP 281 receives a signal indicating that an object of cooling has been mounted or removed from one of the respective output parts 413 or 415, the SVP 281 specifies the next mounting or removal position by referring to the mounting/removal rules for objects of cooling, and displays the specified position on the input-output console terminal 282. Furthermore, in cases where an object of cooling is mounted in a position that differs from the position where mounting is to be performed next, the SVP 281 displays an error message indicating that the mounting position is different on the input-output console terminal 282, and performs a control action so that the processing is not allowed to proceed until it is detected that an object of cooling has been mounted in the correct position.

The SVP 281 reads out the mounting/removal rules 76 for radiators, and executes mounting or removal control processing that is based on these rules 76 (S5). For instance, this processing can be performed on the basis of a signal from the radiator mounting/removal signal output part 417, which outputs a specified signal when the mounting or removal of a radiator is performed. For example, in the processing of S4, if it is detected that a circuit board has been mounted in the right side region 407R of the logical part 39, the SVP 281 specifies the mounting position corresponding to the right side region 407R by referring to the mounting/removal rules 75 for radiators, and displays the specified position and an instruction message giving instructions for the mounting of a radiator in this position on the input-output console terminal 282. Furthermore, for example, in cases where it is detected that a radiator has been mounted in a position that differs from this position, the SVP 281 displays an error message indicating that the mounting position is different on the input-output console terminal 282, and performs a control action so that the processing is not allowed to proceed until it is detected that a radiator has been mounted in the correct position. Furthermore, for example, in the processing of S4, if it is detected that all of the circuit boards have been removed from the right side region 407R of the logical part 39, the SVP 281 specifies a mounting position corresponding to the right side region 407R by referring to the radiator mounting/removal rules 75, and displays the specified position and an instruction message instructing that a radiator be removed from this position on the input-output console terminal 282. Furthermore, for example, in cases where it is detected that a radiator has been removed from a position that differs from this position, the SVP 281 displays an error message indicating that the removal position is different on the input-output console terminal 282, and performs control so that processing is not allowed to proceed until it is detected that a radiator has been removed from the correct position.

As a result of the above series of processing operations, the mounting and/or removal operation is completed. Furthermore, in this processing, in cases where the processing is devised so that N (N is an integer of 1 or greater) objects of cooling can be mounted in a mounting region corresponding to a certain radiator, if it is detected that M (N>M) objects of cooling have been mounted, instructions may be given to mount radiators in positions corresponding to this mounting region. If this is done, there is no need for the new mounting of radiators even if the number of objects of cooling mounted in this mounting region increases.

Figure 10:
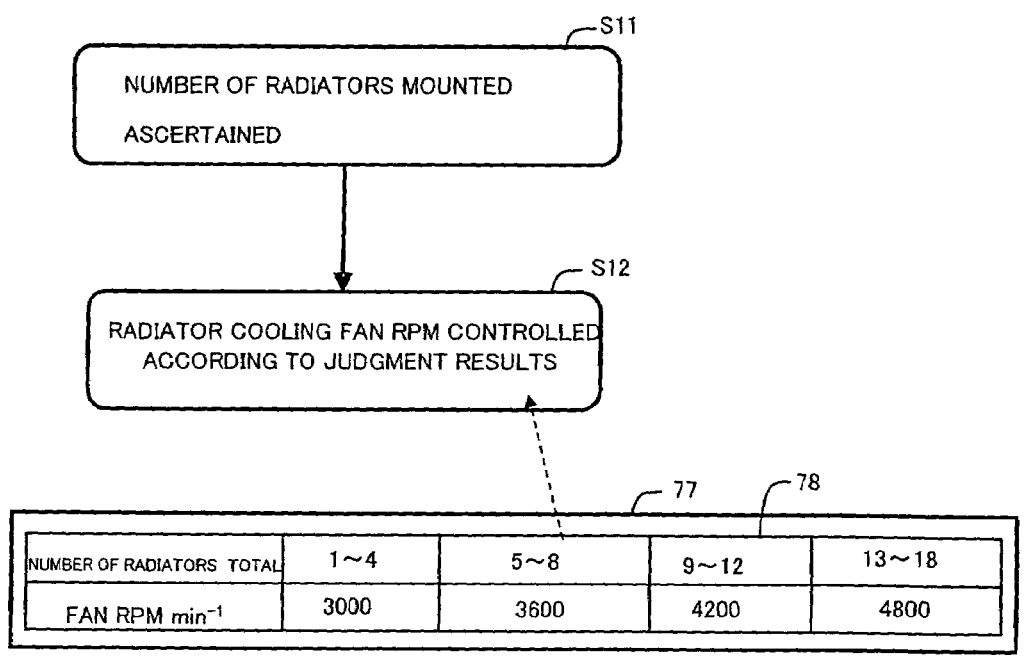
FIG. 10 shows one example of the flow of processing of the driving control of the exhaust fan.

FIG. 10 shows one example of the processing flow of exhaust fan driving control.

For example, the processing shown in this figure can be performed by the cooling control processing part 61 (see FIG. 6). The cooling control processing part 61 can be realized by means of hardware, software or a combination of both. This processing may also be performed by another processing part (e.g., the SVP 281, or the MP 110M or 120M mounted in a CHA 110 or DKA 120) instead of the cooling control processing part 61. Below, this processing will be described with the cooling control processing part 61 as the main body performing the processing.

The cooling control processing part 61 initiates the control processing of the exhaust fan 42 either periodically or in response to the occurrence of a specified event (e.g., the detection of a signal from the radiator mounting/removal signal output part 417).

First, the cooling control processing part 61 judges the number of radiators mounted (S11). For example, this processing can be performed by writing the number of times that the cooling control processing part 61 receives a signal indicating the mounting of a radiator into a specified storage region as the number of radiators mounted, and making reference to this number of radiators mounted. The number of radiators actually mounted can be controlled by performing processing which is devised so that each time that a signal indicating that a radiator has been mounted is received, the number of radiators mounted is increased by 1, and so that each time that a signal indicating that a radiator has been removed is received, the number of radiators mounted is decreased by 1.

The cooling control processing part 61 controls the rpm of the exhaust fan 42 on the basis of the number of radiators mounted ascertained in S11 (S12). For example, the cooling control processing part 61 can perform this processing by referring to an exhaust fan control table 78 that is registered beforehand in a specified storage region 77 (e.g., a memory). The fan rpm values corresponding to the respective numbers of radiators mounted are registered in the exhaust fan control table 78. According to this table 78, in a case where it is ascertained that the number of radiators mounted has increased from "4" to "5", the cooling control processing part 61 performs processing that increases the rpm of the respective exhaust fans 42 from "3000" to "3600".

Figure 11A:
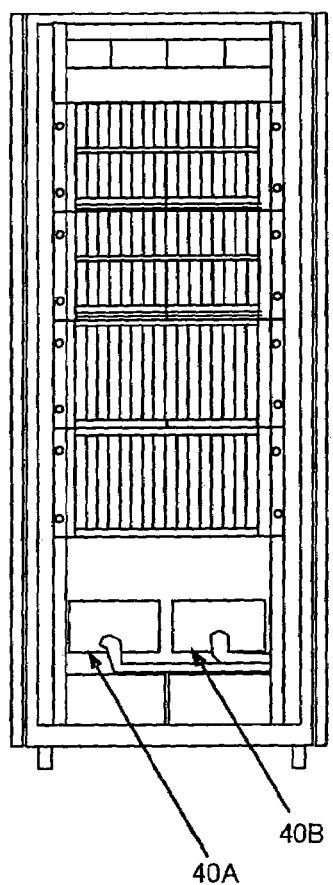
FIG. 11A shows a front view of the disk array device.
Figure 11B:
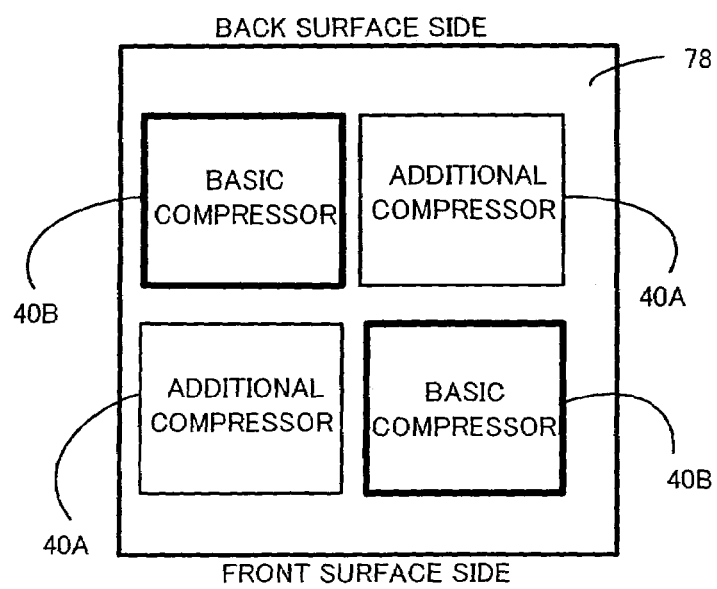
FIG. 11B shows the disposition relationship of the compressor.

The above has been a description relating to the cooling structure of the disk array device 100 of the first embodiment. Furthermore, in this first embodiment, as was described above, a structure in which the front surface side and back surface side of the disk array device 100 are symmetrical can be formed. For example, in a case where the basic compressor 40A (the compressor corresponding to the radiators 64A and 32A mounted in the initial stage) is mounted in a location that is lower than the logical part 39, and an additional compressor 40B (a compressor corresponding to the radiators 64B and 32B that are mounted in stages later than the initial stage) is mounted, as shown in FIG. 11A, the basic compressor 40A and additional compressor 40B can be mounted on a mounting surface 78 disposed in the casing 35 so that a positional relationship that is symmetrical is obtained between the front surface side and back surface side.

Thus, in the abovementioned first embodiment, radiators that cool the air that flows toward the objects of cooling from the outside of the disk array device 100 by means of a cooling medium are mounted between the front cover 36F (and rear cover 36R) and the objects of cooling. As a result, the objects of cooling can be indirectly cooled by means of the cooling medium.

Figure 12:
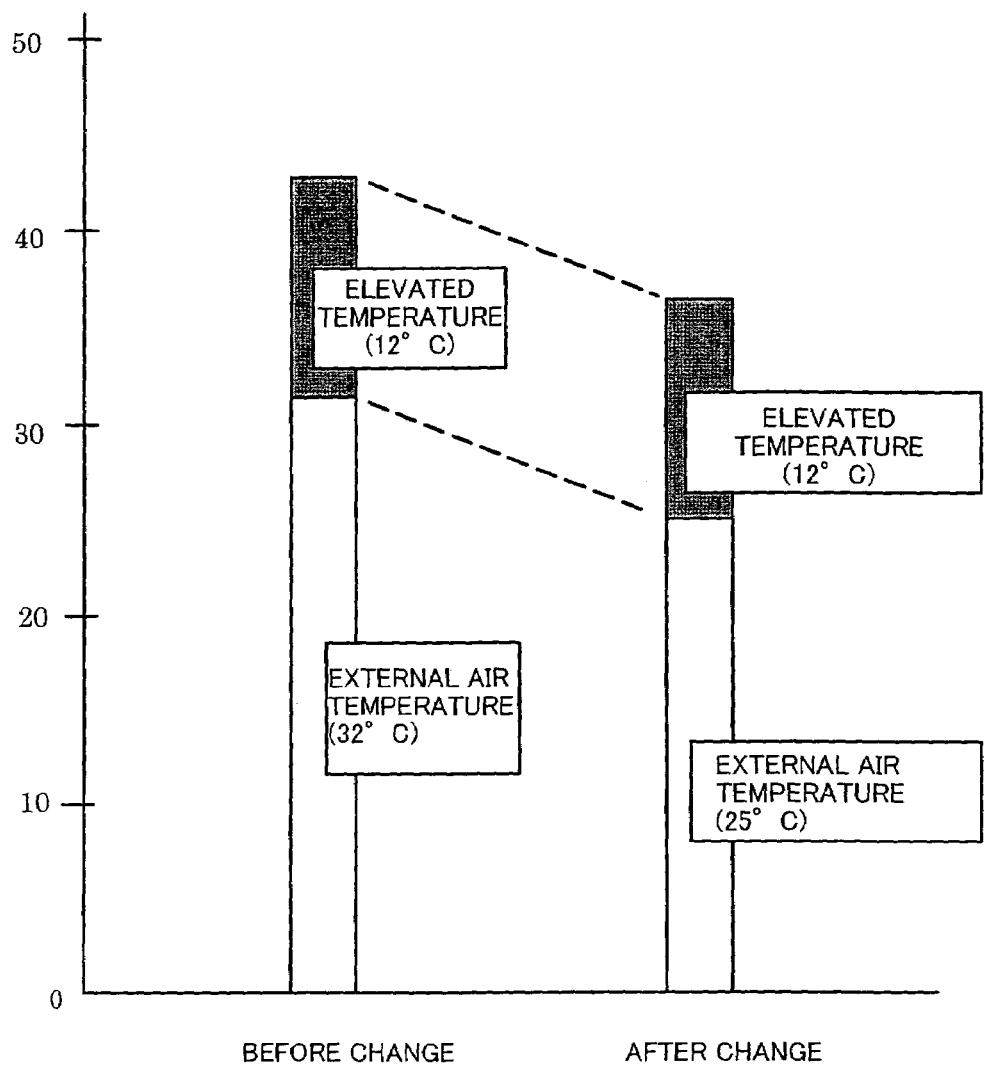
FIG. 12 shows a concrete example of the effect of the first embodiment of the present invention.

Furthermore, in the abovementioned first embodiment, thermostats 59 are disposed on the downstream sides (back surface sides) of the radiators 31U and 31L, and control is performed so that the temperature detected by the thermostats 59 is a specified temperature. Accordingly, for example, in a case where this specified temperature is 25 degrees, the ambient temperature of the disk array device 100 is 32 degrees as shown in FIG. 12, and even if there is a temperature elevation of 12 degrees in the objects of cooling, the temperature of the air that is fed to the objects of cooling cam be kept to 25 degrees or less; consequently, an up-side margin of at least 7 degrees can be achieved.

Furthermore, in the abovementioned first embodiment, cooling is performed by means of radiators 31U and 31L and compressors 40A and 40B; accordingly, noise can be reduced compared to cases in which only an exhaust fan 42 is used.

Furthermore, in the abovementioned first embodiment, the temperature of the air that is taken into the inside of the disk array device 100 can be lowered by means of the radiators 31U and 31L; accordingly, the flow passage of the air can be made narrow. Consequently, in the disk array device 100, the distances between given constituent elements and other constituent elements (e.g., the mounting pitch of the disk type storage devices) can be reduced, so that the disk array device 100 can be made much more compact.

Embodiment 2

Other embodiments will be described below. Furthermore, in the following description, mainly points of difference from the abovementioned embodiment will be described; the description of points that are shared with the abovementioned embodiment will be omitted or abbreviated.

Figure 13:
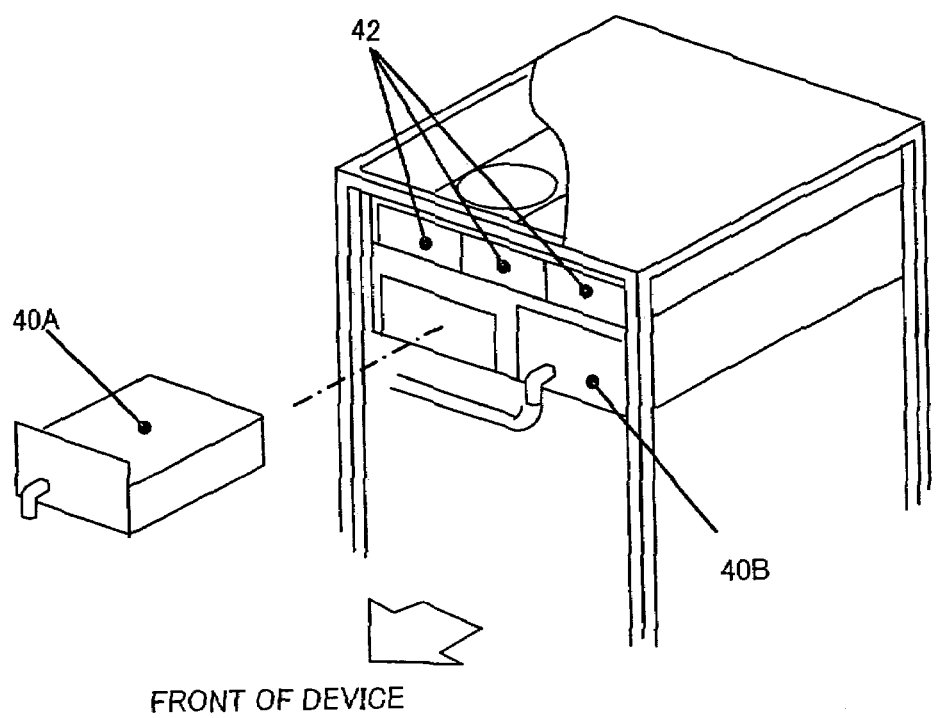
FIG. 13 shows the mounting position of the compressor in a disk array device constituting a second embodiment of the present invention.

FIG. 13 shows the mounting positions of the compressors in a disk array device constituting a second embodiment of the present invention.

In the second embodiment, the compressors 40A and 40B are disposed in the upper part of the disk array device 100 (e.g., above the disk part 38, or in other words, in the vicinity of the exhaust fan 42).

Embodiment 3

FIG. 14A shows a front view of a disk array device constituting a third embodiment of the present invention. FIG. 14B shows an example of the disposition of the radiator in this third embodiment.

The disk array device 600 of the third embodiment is called an additional housing; here, a further disk part 38 is present instead of a logical part 39 being present. Accordingly, as is shown for example in FIG. 14B, radiators 64A, 64B corresponding to the disk part 38 are mounted in the disk part 38, and radiators 32A, 32B corresponding to the logical part 39 are not mounted.

Thus, the disposition positions of the radiators and the like can be varied according to the construction of the disk array device. Furthermore, the disposition positions of the radiators may have further variations in terms of size and the like.

Embodiment 4

Figure 15A:
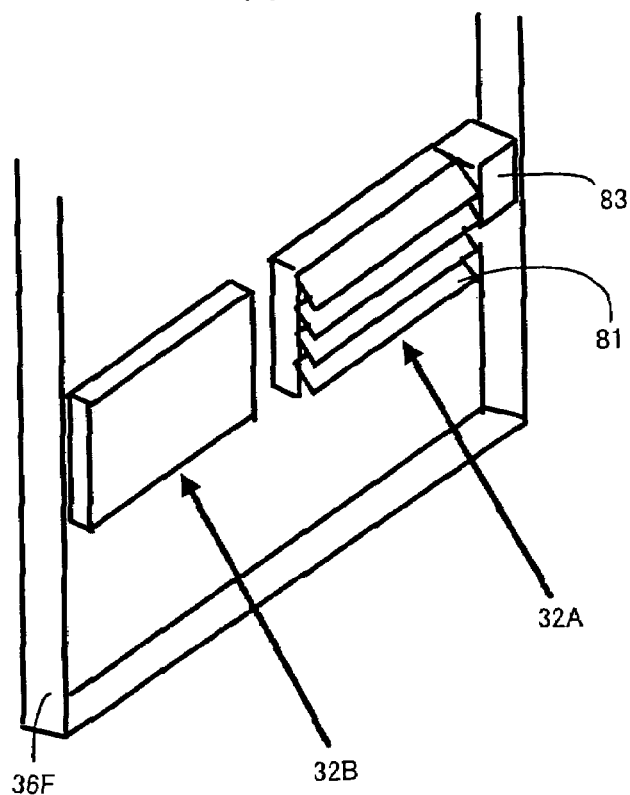
FIG. 15A shows an example of the construction of the radiator that is mounted in a disk array device constituting a fourth embodiment of the present invention.

FIG. 15A shows an example of the radiators mounted in a disk array device constituting a fourth embodiment of the present invention.

In the fourth embodiment, a shutter 81 that opens and closes the back surface of the radiator is provided for at least one radiator, e.g., a radiator that 32A that corresponds to an object of cooling (for example, a circuit board) that is mounted later than the initial stage. When the shutter 81 is in an open state, air that is cooled by the radiator 32A can pass through the radiator 32A, and can proceed to the object of cooling. However, when the shutter 81 is in a closed state, air cannot pass through the radiator 32A.

The opening and closing of the shutter 81 is accomplished (for example) by means of an electromagnetic valve 83. Furthermore, for example, the control of the electromagnetic valve 83 can be performed by the cooling control processing part 61.

Figure 15B:
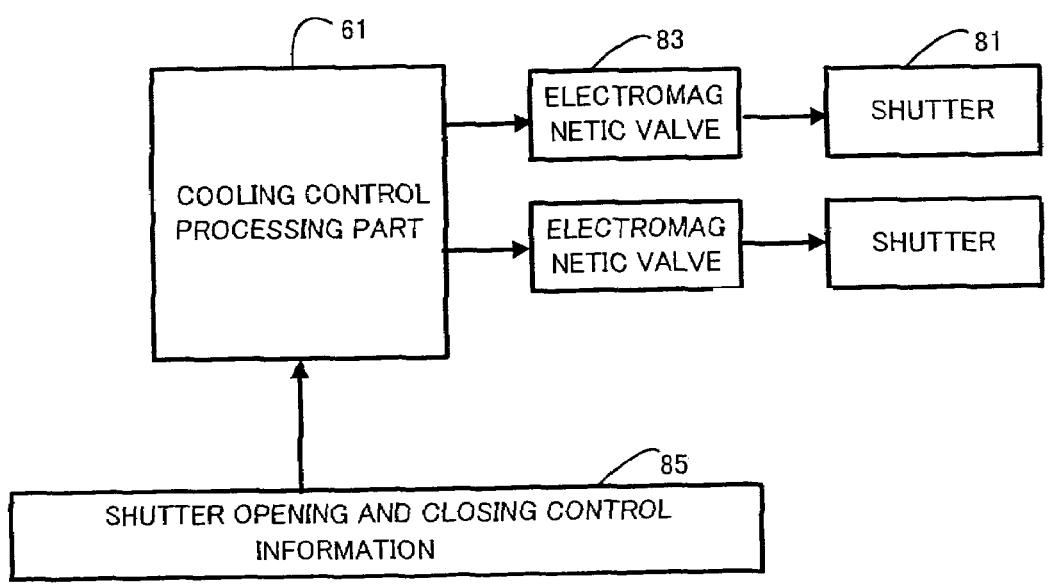
FIG. 15B shows an example of the function construction that is used to control the shutter.

FIG. 15B shows an example of the functional construction that is used to control the shutter.

The cooling control processing part 61 inputs shutter opening and closing control information 85 from (for example) a specified storage region, controls the radiator to which the electromagnetic valve 83 corresponds on the basis of the input shutter opening and closing control information 85, and controls which radiator shutter is closed or opened.

Various types of information can be used as the shutter opening and closing control information; for example, at least one of the following three types of information (1) through (3) can be used:

(1) number of currently mounted disk type storage devices 150 and/or circuit boards, and threshold value of number of mounted disk type storage devices 150 and/or circuit boards, (2) information indicating the positions in which the objects of cooling are mounted, and (3) temperature inside the disk array device 100 and target temperature.

In the case of the abovementioned information (1), for example, the cooling control processing part 61, SVP 281 or the like counts the number of times that signals indicating mounting are received for each type of object of cooling, and counts the number of times that signals indicating removal are received for each type of object of cooling. Then, on the basis of these count results, the cooling control processing part 61 or SVP 281 can determine the abovementioned current mounted number. Furthermore, if the abovementioned mounted number threshold value is registered beforehand in a specified storage region, the cooling control processing part 61 can input this number. For example, in cases where the current mounted number exceeds the mounted number threshold value, the cooling control processing part 61 controls specified electromagnetic valves 83 or all of the electromagnetic valves 83 so that the shutters 81 are closed.

The abovementioned information (2) can be specified according to the signal output parts from which signals are received. For example, in cases where the cooling control processing part 61 detects that a specified number of objects of cooling have been mounted in locations corresponding to radiators that have shutter 81, the cooling control processing part 61 controls the electromagnetic valves 83 corresponding to these radiators so that the shutters 81 are closed. Furthermore, for example, the locations of radiators on which shutters are mounted can be specified (for example) by inputting information indicating this into the SVP 281 from the input-output console terminal 282, and having the cooling control processing part 61 acquire this information from the SVP 281.

In the case of (3), the cooling control processing part 61 can specify the temperature inside the disk array device 100 (hereafter referred to as the current temperature) by means of a signal from a temperature sensor disposed in a specified location, and can specify the target temperature for this temperature by reading this target temperature out from a specified storage region in which this target temperature has been registered beforehand. For example, the cooling control processing part 61 construction alteration control the number (and/or location) of shutters 81 that are open in accordance with the magnitude of the difference between the current temperature and the target temperature. In concrete terms, for example, the cooling control processing part 61 refers to a table in which the correspondence relationship between magnitude of the difference between the current temperature and the target temperature and the number (and/or location) of the shutters 81 that are open is written, specifies the radiators in which the shutters 81 need to be opened from this table, and control the electromagnetic valves 83 of the specified radiators so that the shutters 81 are opened. In this case, for example, more shutters 81 are opened as the difference between the current temperature and target temperature increases.

Embodiment 5

Figure 16:
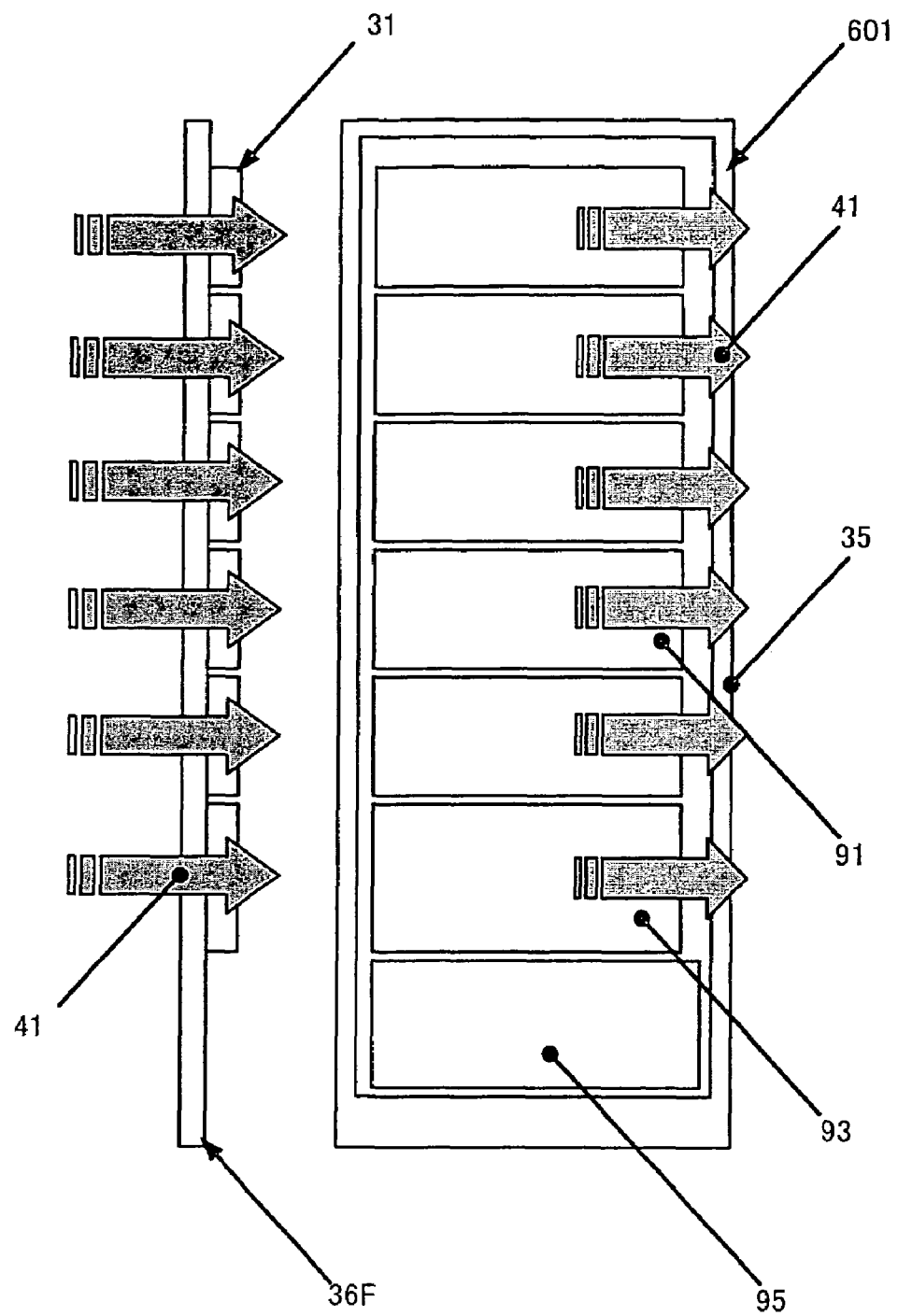
FIG. 16 shows a side view of a disk array device 601 constituting a fifth embodiment of the present invention.

FIG. 16 shows a side view of a disk array device 601 constituting a fifth embodiment of the present invention.

As was described above, a radiator 31 is disposed on the back surface of the front cover 36F of the disk array device 601. Furthermore, a plurality of disk parts 91 are lined up in the vertical direction inside the casing 35. A logical part 93 is mounted beneath the plurality of disk parts 91, and a compressor 95 is mounted beneath the logical part 93.

In this disk array device 601, the air 41 that is taken in from the front cover 36F is discharged from the back surface of the disk array device 601. In this construction, there is no need to mount a radiator on the back surface of the disk array device 601.

Embodiment 6

Figure 17:
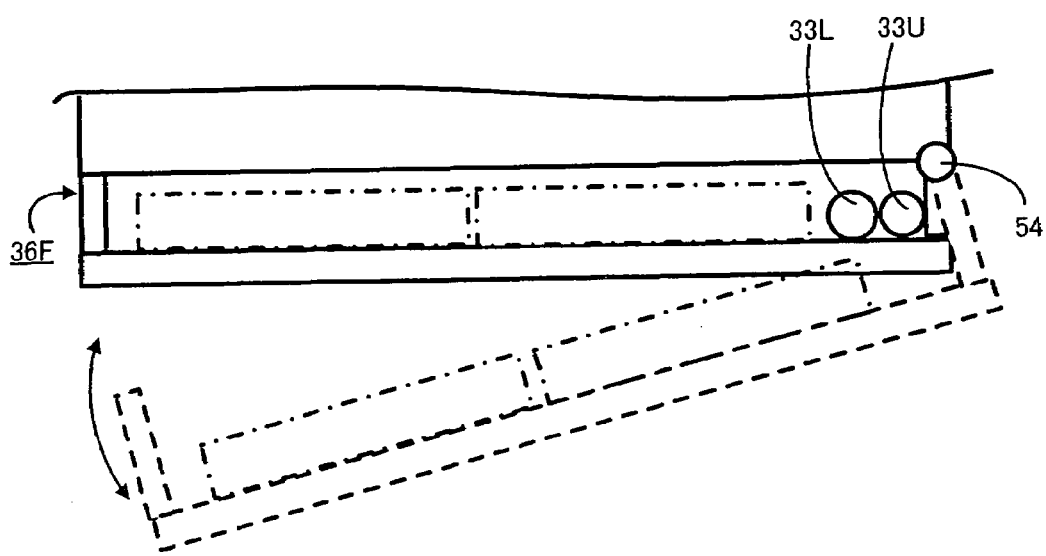
FIG. 17 shows an example of the connection construction between the front cover 36F and the casing 35 in a sixth embodiment of the present invention.

FIG. 17 shows an example of the connection construction between the front cover 36F and the casing 35 in a sixth embodiment of the present invention.

In this sixth embodiment, unlike the first embodiment, the front cover 36F as a whole is opened and closed by means of a rotating shaft 54.

Furthermore, the connection between the front cover 36F and the casing 35 is not limited to this sixth embodiment or the abovementioned first embodiment.

Embodiment 7

Figure 18:
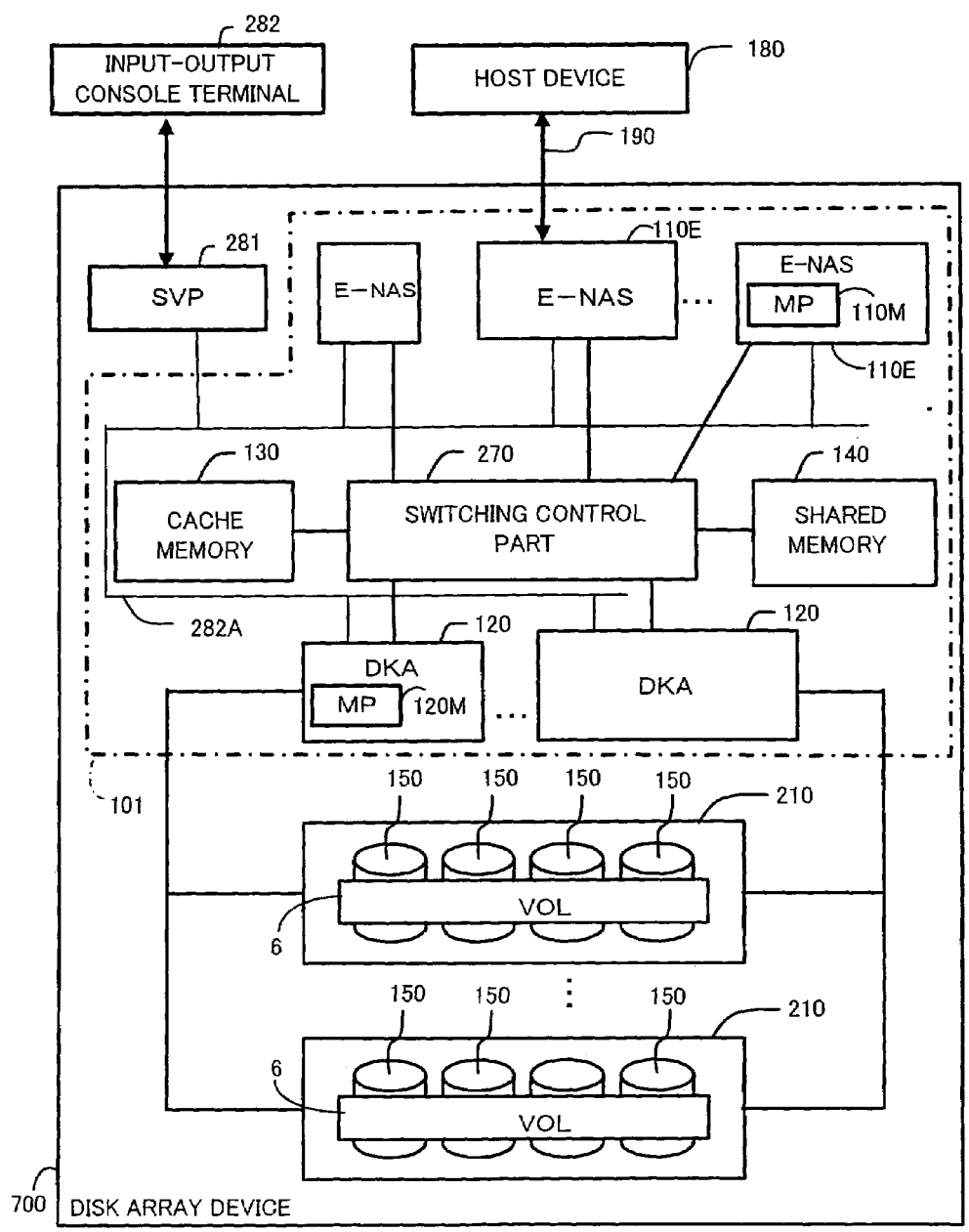
FIG. 18 sows an example of the construction of a disk array device constituting a seventh embodiment of the present invention.

FIG. 18 shows an example of the construction of a disk array device constituting a seventh embodiment of the present invention.

In the disk array device 700 of the seventh embodiment, adapters (hereafter referred to as "E-NAS" as an abbreviation of "embedded NAS") that have the function of an NAS (network attached storage) 110E are mounted as CHAs 110. These E-NAS can also be realized by means of circuit boards.

Figure 19:
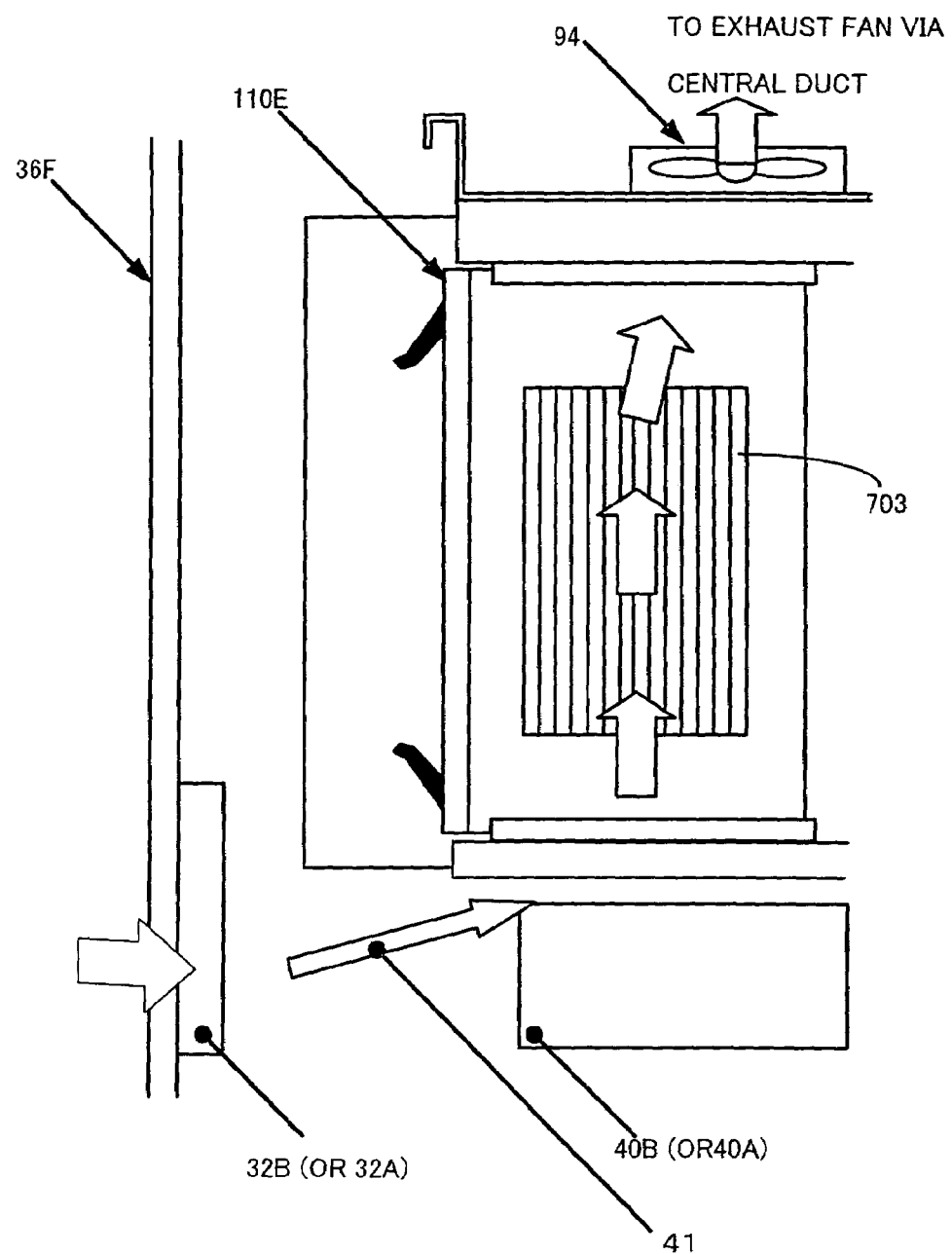
FIG. 19 is an explanatory diagram of the E-NAS cooling method.

FIG. 19 is an explanatory diagram of the E-NAS cooling method.

The radiator 32B corresponding to the logical part 39 is mounted in a position that is lower than the height at which the E-NAS 110E are disposed. An internal exhaust fan 94 that feeds the air 41 inside the logical part 39 toward the central duct is disposed on the upper part of the logical part 39 (the upper part of the circuit board on which the logical part 39 is mounted).

In this construction, the air (cooled air) 41 that passes through the radiator 32B rises while advancing, and passes through the E-NAS 110 E from bottom to top; this air then exits to the outside of the logical part 39 via the internal exhaust fan 94. As a result, the heat sinks 703 of the E-NAS 110E can be efficiently cooled.

Embodiment 8

Figure 20A:
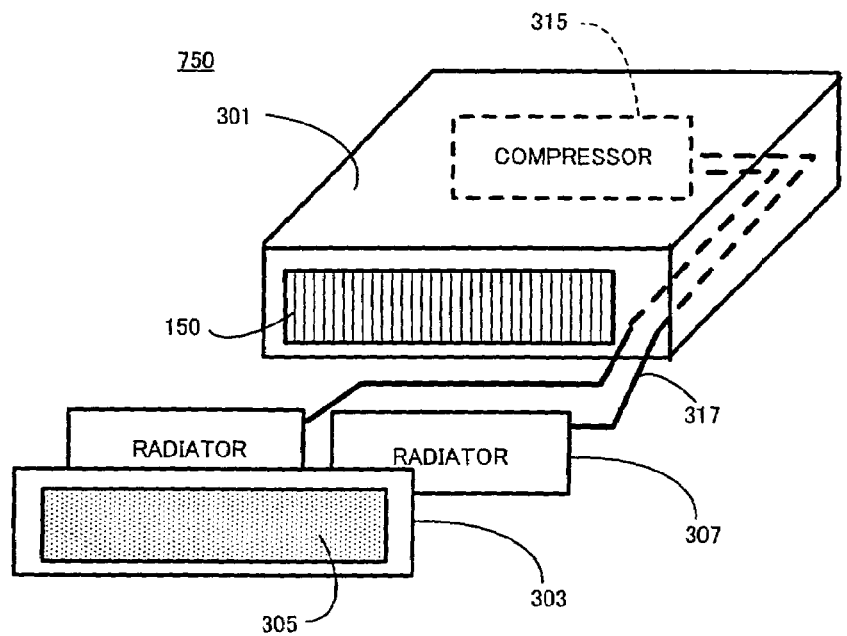
FIG. 20A shows a perspective view of a disk array device constituting an eighth embodiment of the present invention.

FIG. 20A shows a perspective view of a disk array device constituting an eighth embodiment of the present invention.

Figure 20B:
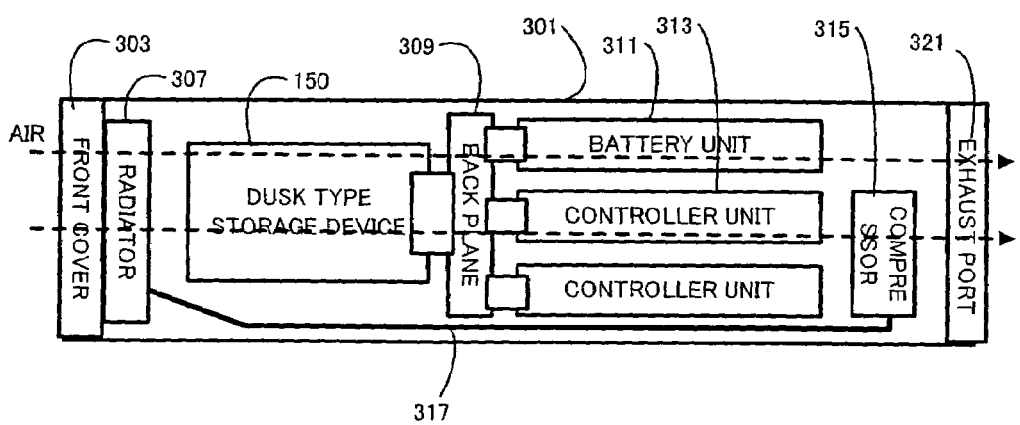
FIG. 20B shows an example of the cross-sectional construction of the disk array device in a section along the direction of depth.

FIG. 20B shows an example of the cross-sectional structure of the disk array device in a sectional view along the direction of depth.

For example, the disk array device 750 of this eighth embodiment is a IU size device. In such a device as well, the characteristic points of the embodiments described so far can be applied.

For example, a casing 301 and a front cover 303 that covers the front surface of the casing 301 are provided. An air intake region (e.g., a region in which through-holes are present) 305 which is used to allow the passage of air from the front surface to the back surface of the front cover 303 is disposed in the front cover 303.

A radiator 307 is disposed between the front cover 303 and the front surface of the casing 301. A compressor 315 is mounted in a specified position of the casing 301 (e.g., in the vicinity of the back surface). The radiator 307 and compressor 315 are connected via a cooling medium pipe 317.

A plurality of disk type storage devices 150 are mounted on the fronts surface side of the casing. The plurality of disk type storage devices 150 are lined up in the lateral direction. A back plane 309 such as a printed board or the like is disposed in the vicinity of the center of the casing 301. A plurality of disk type storage devices 150 are connected to the front surface of the back plane 309.

A battery unit 311 which serves as a power supply for the disk array device 301, and controller units 311 which control the operation of the disk array device 301, are connected to the back surface of the back plane 309.

An exhaust port 321 is formed in the back surface of the casing 301. Air (cooled air) that is taken in from the front cover 303 via the radiator 307 passes through the disk type storage devices 150, the back plane 309 (in which (for example) holes used for the passage of air to specified positions are formed), the controller unit 313 and the battery unit 311 so that these parts are cooled, and this air is then discharged from the exhaust port 321.

Embodiment 9

Figure 21:
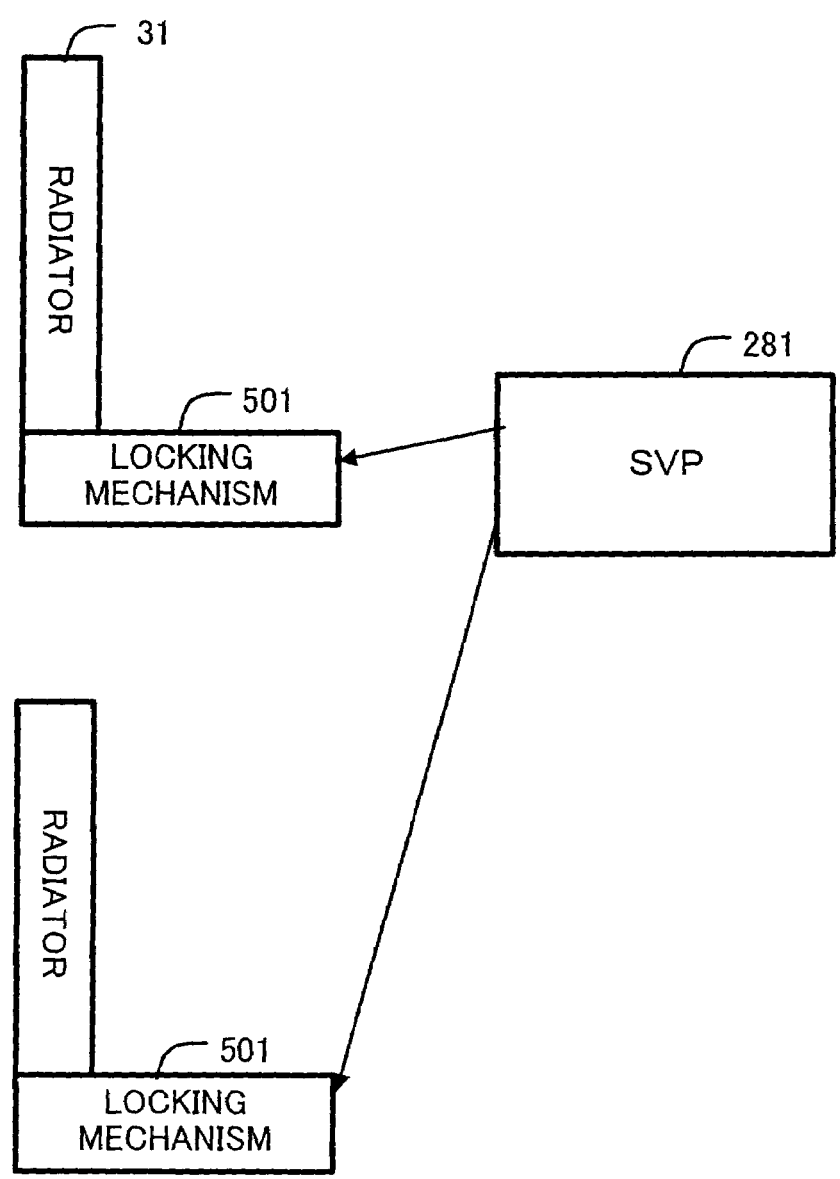
FIG. 21 is an explanatory diagram of the radiator removal control method in a ninth embodiment of the present invention.

FIG. 21 is an explanatory diagram of the radiator removal control method in a ninth embodiment of the present invention.

In the ninth embodiment, a locking mechanism 501 that controls whether the removal of radiators is prevented or permitted is disposed in the mounting position of each radiator. In this case, for example, in the processing of S5 in FIG. 9, the SVP 281 (or other constituent element) controls the respective locking mechanisms 501 so that the radiator removal lock is removed only for radiators whose removal is permitted; in the case of other radiators, control is performed so that the removal lock is left in place.

Embodiment 10

Figure 22:
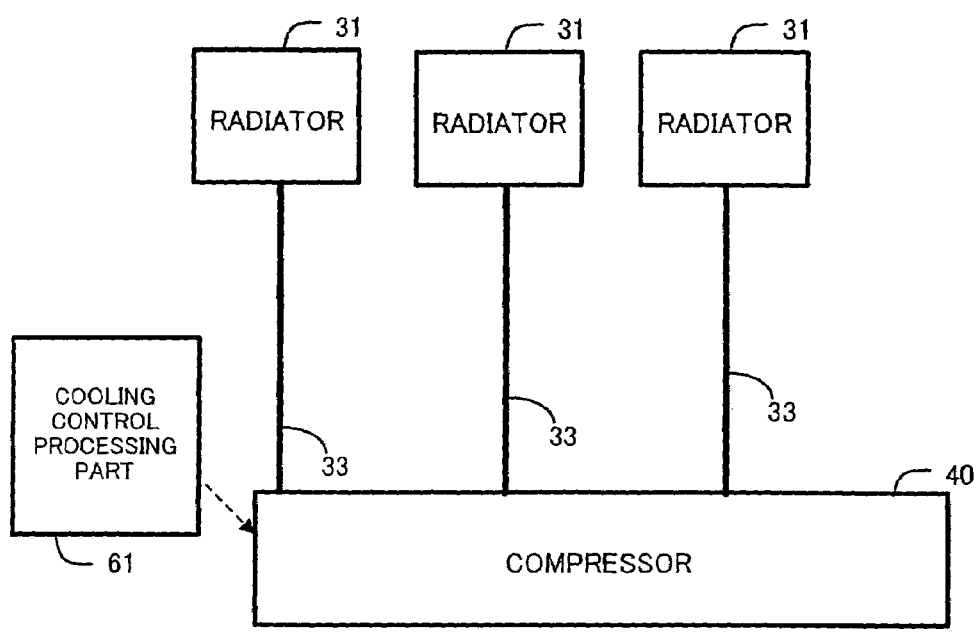
FIG. 22 shows the connection construction between the radiator and the compressor in a tenth embodiment of the present invention.

FIG. 22 shows the connection structure between the radiators and compressors in a tenth embodiment of the present invention.

A plurality of independent cooling medium pipes 33 are respectively prepared for a plurality of radiators 31. Specifically, control that allows or prevents the flow of the cooling medium is possible for each radiator 31. For example, this control can be performed by the cooling control processing part 61 controlling the compressors 40.

Embodiment 11

Figure 23A:
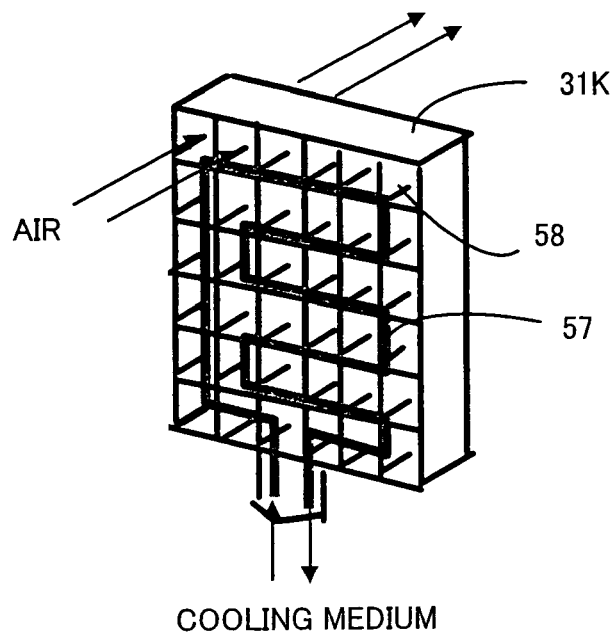
FIG. 23A shows an example of construction of the radiator that is used to cool a first type of object of cooling.
Figure 23B:
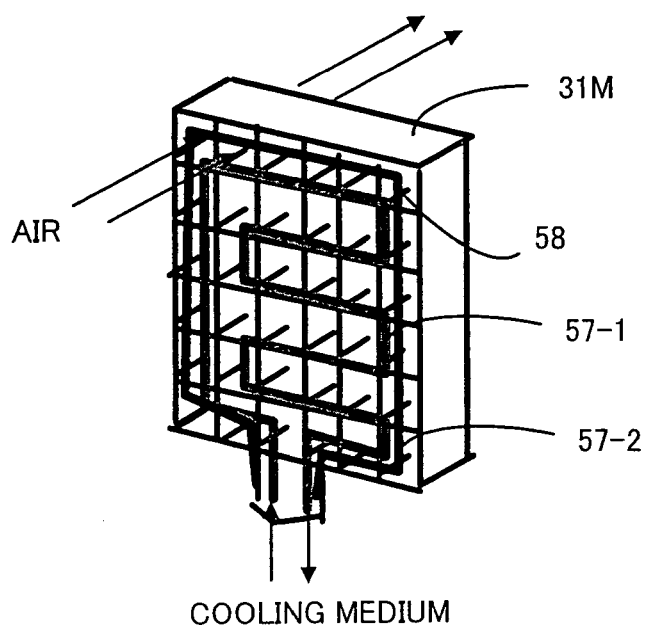
FIG. 23B shows an example of construction of the radiator that is used to cool a second type of object of cooling.

FIG. 23A shows an example of the construction of the radiator that is used to cool objects of cooling of a first type. FIG. 23B shows an example of the construction of the radiator that is used to cool objects of cooling of a second type.

The objects of control of the second type (e.g., circuit boards such as E-NAS or the like) may reach higher temperatures than the objects of cooling of the first type (e.g., disk type storage devices). Accordingly, the radiators that are used to cool the objects of cooling of the second type are constructed so as to have a higher cooling capacity than the radiators that are used to cool the objects of cooling of the first type. For example, the number of cooling flow passage pipes disposed in the radiators corresponding to the objects of cooling of the second type is greater than that of the radiators corresponding to the objects of cooling of the first type.

Several preferred embodiments of the present invention were described above. However, the present invention is not limited to these embodiments; it goes without saying that various alterations are possible within limits that involve no departure from the spirit of the present invention. For example, all or part of the processing that is performed by the abovementioned cooling control processing part 61 may also be performed by the SVP 281, CHAs or the like. Similarly, all or part of the processing that is performed by the SVP 281 may also be performed by the cooling control processing part 61, CHAs or the like.

What is claimed is:

1. A disk array device which has a plurality of disk type storage devices, comprising:
    at least one object of cooling that includes at least one of the plurality of disk type storage devices;
    a cooling part; and
    an air intake part which takes in air that is present on the outside of said disk array device, and feeds said taken-in air into said cooling part, and comprises said cooling part on the upstream side of said air with respect to said object of cooling,
    wherein said cooling part cools said taken-in air to produce cooled air to cool said of object of cooling.

2. The disk array device according to claim 1, wherein said cooling part is a radiator.

3. The disk array device according to claim 2, wherein said radiator includes a cooling medium flowing therein.

4. The disk array device according to claim 3, further comprising a compressor connected to said cooling part to effect removal of heat from said cooling medium.

5. The disk array device according to claim 3, wherein said cooling medium is a fluid.

6. A method of cooling a disk array device comprising:
    receiving air from outside of said disk array device as taken-in air;
    cooling said taken-in air to produce cooled air; and
    cooling one or more objects comprising said disk array device with said cooled air,
    wherein said cooling part includes a radiator having a cooling medium therein, said cooling medium receiving heat from said taken-in air thereby cooling said taken-in air.

7. The method of claim 6 wherein said one or more objects of said disk array device include a plurality of disk storage devices.

8. The method of claim 6 wherein said step of cooling said taken-in air includes passing said taken-in air across a cooling part.

9. The method of claim 6 wherein said cooling medium is a fluid.

10. A method of cooling a disk array device which has a plurality of disk type storage devices, the method comprising:

feeding air from outside of said disk array device into a cooling part, said cooling part comprising a cooling medium, said cooling part connected to a compressor to remove heat from said cooling medium;

producing cooled air with said cooling part, and cooling at least one of the plurality of disk type storage devices with said cooled air.

\* \* \* \* \*